United States Patent
Kuroda

(10) Patent No.: US 9,979,441 B2
(45) Date of Patent: May 22, 2018

(54) INDUCTIVE RELAYED COUPLING CIRCUIT BETWEEN SUBSTRATES

(75) Inventor: Tadahiro Kuroda, Kanagawa (JP)

(73) Assignee: THRUCHIP JAPAN INC., Tokyo (JP)

( * ) Notice: Subject to any disclaimer, the term of this patent is extended or adjusted under 35 U.S.C. 154(b) by 2189 days.

(21) Appl. No.: 12/737,025

(22) PCT Filed: Jun. 1, 2009

(86) PCT No.: PCT/JP2009/059947
§ 371 (c)(1),
(2), (4) Date: Dec. 2, 2010

(87) PCT Pub. No.: WO2009/148007
PCT Pub. Date: Dec. 10, 2009

(65) Prior Publication Data
US 2011/0156488 A1   Jun. 30, 2011

(30) Foreign Application Priority Data
Jun. 3, 2008   (JP) .................. 2008-146248

(51) Int. Cl.
*H04B 5/00*   (2006.01)
*H04B 5/02*   (2006.01)
(Continued)

(52) U.S. Cl.
CPC ............... *H04B 5/02* (2013.01); *H01L 23/48* (2013.01); *H01L 23/5227* (2013.01);
(Continued)

(58) Field of Classification Search
CPC ............................... H02J 50/10; H04B 5/0093
(Continued)

(56) References Cited

U.S. PATENT DOCUMENTS 4,960,983 A * 10/1990 Inoue ................. G06K 7/10336
235/449
5,701,037 A * 12/1997 Weber et al. ................. 257/777
(Continued)

FOREIGN PATENT DOCUMENTS

JP   2001-127672 A   5/2001
JP   2005-228981 A   8/2005
(Continued)

OTHER PUBLICATIONS

D. Mizoguchi et al, "A 1.2GB/S/PIN Wireless Superconnect Based on Inductive Inter-Chip Signaling (IIS)", 2004 IEEE International Solid-State Circuits Conference (ISSCC'04), Dig. Tech. Papers, pp. 142-143, 517, Feb. 2004.
(Continued)

*Primary Examiner* — Adi Amrany
(74) *Attorney, Agent, or Firm* — Michael Best & Friedrich LLP

(57) ABSTRACT

An electronic circuit carries out communication by inductive coupling between chips which are stacked and mounted. The electronic circuit relays an inter-chip communication signal by a repeater which receives a signal from a transmitter to recognize a transmission source and a receiving destination, and relays a received signal when the repeater itself exists between the transmission source and the receiving destination, and does not relay the received signal when the repeater itself does not exist between the transmission source and the receiving destination. Accordingly, data can be transferred at high speed up to a chip farther than the dimensions of a coil through communications by inductive coupling between the stacked and mounted chips.

4 Claims, 34 Drawing Sheets

(51) Int. Cl.

| | |
|---|---|
| *H02J 50/10* | (2016.01) |
| *H01L 23/48* | (2006.01) |
| *H01L 23/522* | (2006.01) |
| *H01L 23/00* | (2006.01) |
| *H01L 25/065* | (2006.01) |

(52) U.S. Cl.
CPC .............. *H01L 24/06* (2013.01); *H01L 24/29* (2013.01); *H01L 24/32* (2013.01); *H01L 24/33* (2013.01); *H01L 25/0657* (2013.01); *H02J 50/10* (2016.02); *H04B 5/0093* (2013.01); H01L 24/48 (2013.01); H01L 24/49 (2013.01); H01L 2223/6677 (2013.01); H01L 2224/05599 (2013.01); H01L 2224/32145 (2013.01); H01L 2224/48091 (2013.01); H01L 2224/48095 (2013.01); H01L 2224/48145 (2013.01); H01L 2224/4911 (2013.01); H01L 2224/73265 (2013.01); H01L 2224/85399 (2013.01); H01L 2225/06527 (2013.01); H01L 2225/06555 (2013.01); H01L 2225/06562 (2013.01); H01L 2924/00014 (2013.01); H01L 2924/01004 (2013.01); H01L 2924/01005 (2013.01); H01L 2924/01006 (2013.01); H01L 2924/01013 (2013.01); H01L 2924/01014 (2013.01); H01L 2924/01029 (2013.01); H01L 2924/01033 (2013.01); H01L 2924/01047 (2013.01); H01L 2924/01075 (2013.01); H01L 2924/01082 (2013.01); H01L 2924/14 (2013.01); H01L 2924/19042 (2013.01); H01L 2924/3025 (2013.01); H01L 2924/30105 (2013.01); H01L 2924/30107 (2013.01)

(58) Field of Classification Search
USPC .......................................................... 307/104
See application file for complete search history.

(56) References Cited

U.S. PATENT DOCUMENTS

| | | | | |
|---|---|---|---|---|
| 6,853,085 | B2* | 2/2005 | Kux .................. | H01L 22/34 257/777 |
| 7,379,713 | B2* | 5/2008 | Lindstedt ............. | H04B 5/02 327/564 |
| 7,768,790 | B2* | 8/2010 | Kuroda ............... | H01L 25/0657 174/260 |
| 7,813,259 | B2* | 10/2010 | Kuroda et al. ................. | 370/201 |
| 8,190,086 | B2* | 5/2012 | Sasaki et al. ................. | 455/41.1 |
| 8,283,944 | B2* | 10/2012 | Kuroda ........................... | 326/37 |
| 8,486,804 | B2* | 7/2013 | Yamazaki et al. ............ | 438/459 |
| 8,648,614 | B2* | 2/2014 | Kuroda et al. ........... | 324/754.01 |
| 2006/0176624 | A1* | 8/2006 | Kuroda et al. ................. | 361/38 |
| 2006/0176676 | A1* | 8/2006 | Kuroda et al. ................ | 361/780 |
| 2007/0273015 | A1 | 11/2007 | Nakashiba | |
| 2007/0274198 | A1* | 11/2007 | Kuroda et al. ................. | 370/201 |
| 2007/0289772 | A1* | 12/2007 | Kuroda .............. | H01L 25/0657 174/260 |
| 2008/0258744 | A1 | 10/2008 | Kuroda et al. | |
| 2009/0021974 | A1* | 1/2009 | Nonomura et al. ............ | 365/63 |
| 2009/0057039 | A1 | 3/2009 | Kuroda et al. | |
| 2009/0196388 | A1* | 8/2009 | Fukaishi et al. .............. | 375/360 |
| 2009/0227205 | A1* | 9/2009 | Rofougaran .................. | 455/41.1 |
| 2009/0245445 | A1* | 10/2009 | Saen et al. ..................... | 375/354 |
| 2009/0322383 | A1 | 12/2009 | Fukaishi et al. | |
| 2011/0021138 | A1* | 1/2011 | Rofougaran .................... | 455/39 |
| 2011/0039493 | A1* | 2/2011 | Kuroda ......................... | 455/41.1 |
| 2012/0217658 | A1* | 8/2012 | Kuroda .......................... | 257/777 |

FOREIGN PATENT DOCUMENTS

| | | |
|---|---|---|
| JP | 2005-348264 A | 12/2005 |
| JP | 2006-050354 A | 2/2006 |
| JP | 2006-066454 A | 3/2006 |
| JP | 2006-105630 A | 4/2006 |
| JP | 2006-173415 A | 6/2006 |
| JP | 2006-173986 A | 6/2006 |
| JP | 2007-318003 A | 12/2007 |
| JP | 2008-067288 A | 3/2008 |
| JP | 2009-026792 A | 2/2009 |
| JP | 2005-203657 A | 7/2009 |
| WO | WO-2007-086285 A1 | 8/2007 |
| WO | WO-2007-145086 A1 | 12/2007 |

OTHER PUBLICATIONS

N. Miura et al., "Analysis and Design of Transceiver Circuit and Inductor Layout for Inductive Inter-Chip Wireless Superconnect", Symposium on VLSI Circuits, Dig. Tech. Papers, pp. 246-249, Jun. 2004.

N. Miura et al., "Cross Talk Countermeasures in Inductive Inter-Chip Wireless Superconnect", in Proc. IEEE Custom Integrated Circuits Conference (CICC'04), pp. 99-102, Oct. 2004.

N. Miura et al., "A 195Gb/s 1.2W 3D-Stacked Inductive Inter-Chip Wireless Superconnect With Transmit Power Control Scheme", IEEE International Solid-State Circuits Conference (ISSCC'05), Dig. Tech. Papers, pp. 264-265, 597, Feb. 2005.

N. Miura et al., "A 1Tb/s 3W Inductive-Coupling Transceiver for Inter-Chip Clock and Data Link", IEEE International Solid-State Circuits Conference (ISSSCC;06), Dig. Tech. Papers, pp. 424-425, Feb. 2006.

N. Miura et al., "A 0.14pJ/b Inductive-Coupling Inter-Chip Data Transceiver With Digitally-Controlled Precise Pulse Shaping", IEEE International Solid-State Circuits Conference (ISSCC'07), Dig. Tech. Papers, pp. 358, 359, 608, Feb. 2007.

H. Ishikuro et al., "An Attachable Wireless Chip Access Interface for Arbitrary Data Rate by Using Pulse-Based Inductive-Coupling Through LSI Package", IEEE International Solid-State Circuits Conference (ISSCC'07), Dig. Tech. Papers, pp. 360-361, 608, Feb. 2007.

H. Ishikuro et al., "Wideband Iductive-Coupling Interface for High-Performance Portable System (Invited)", IEEE Custom Integrated Circuits Conference (CICC'07), Dig. Tech. Papers, pp. 13-20, Sep. 2007.

International Search Report PCT/ISA/210, App. No. PCT/JP2009/059947 (1 page).

Office Action issued in Japanese Application No. 2008-146248, dated Jun. 11, 2014.

* cited by examiner

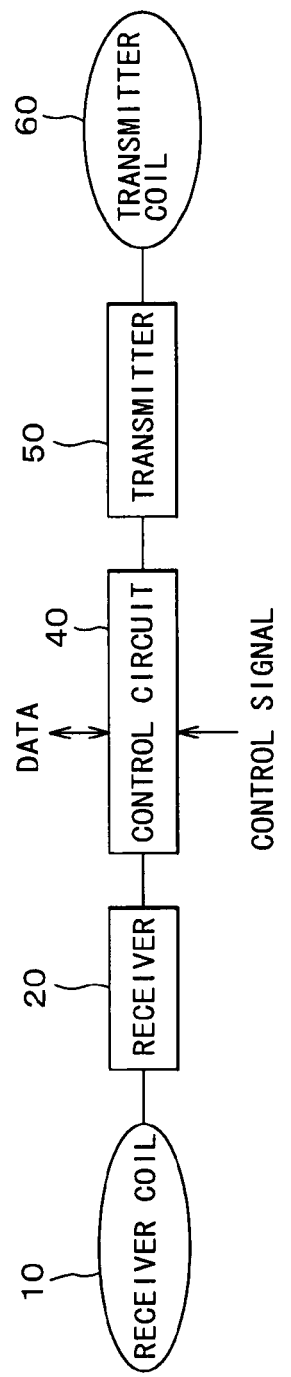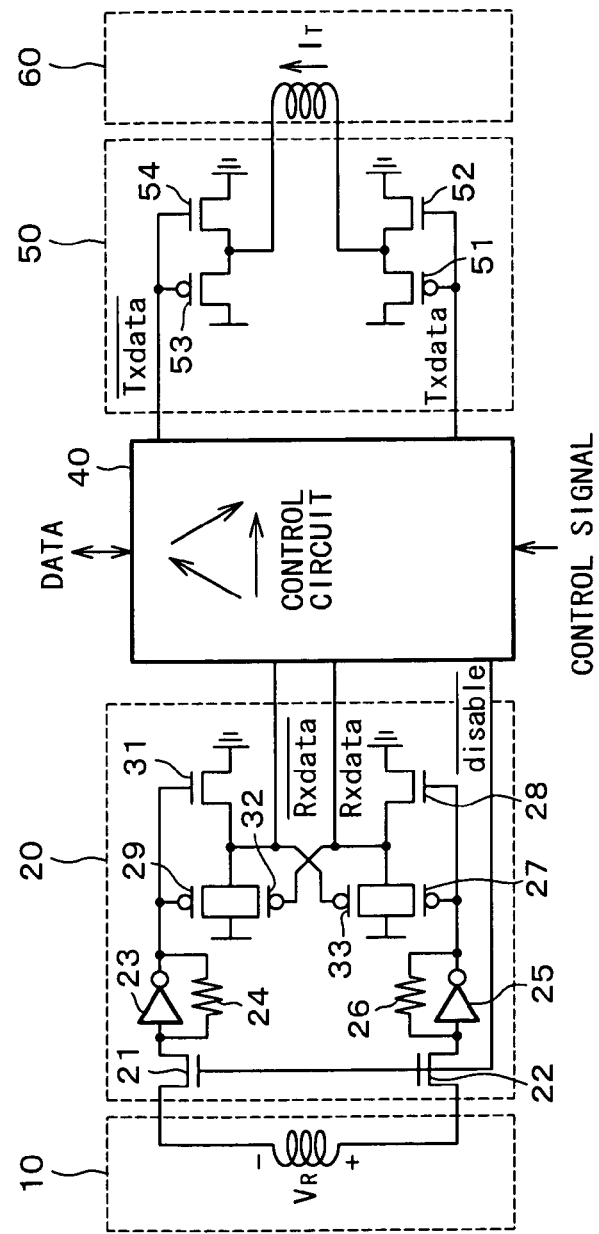
FIG. 1A
FIG. 1B

F I G. 6
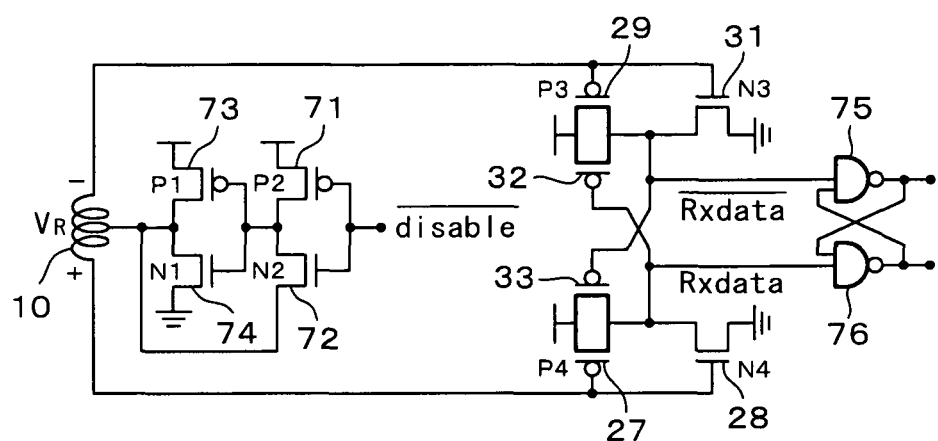

F I G. 10
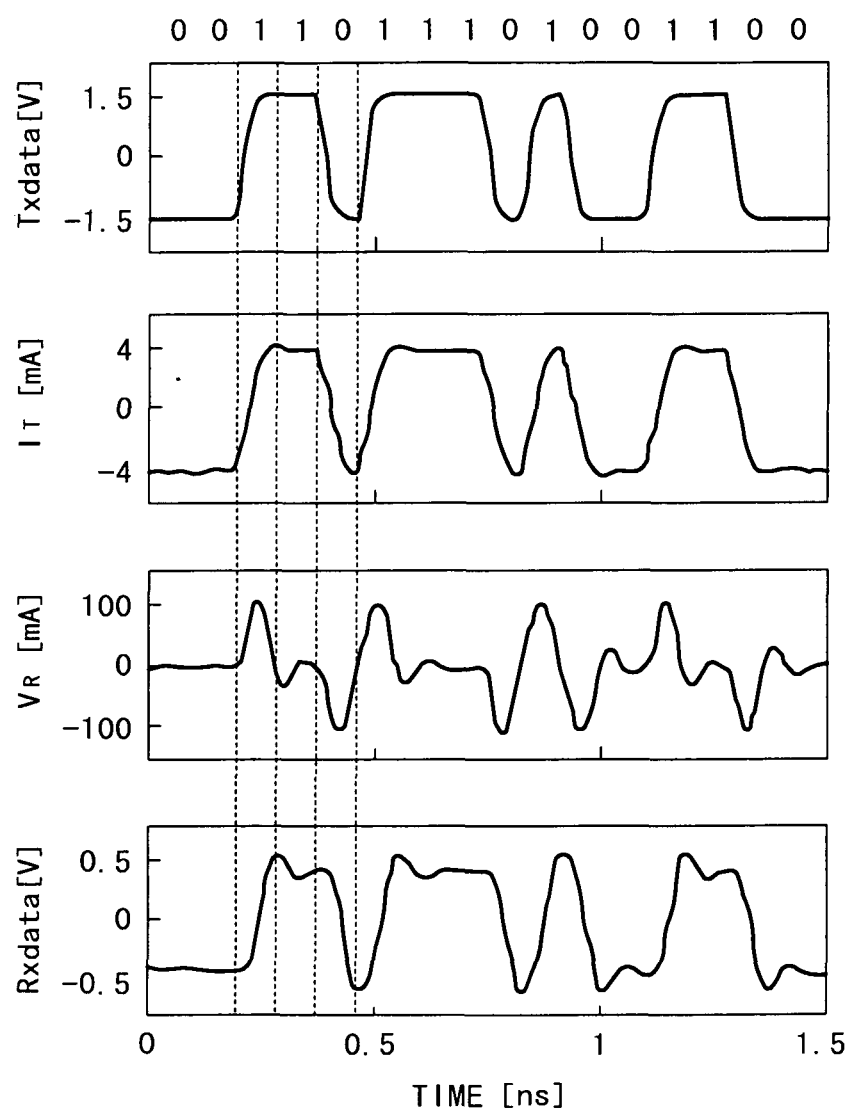

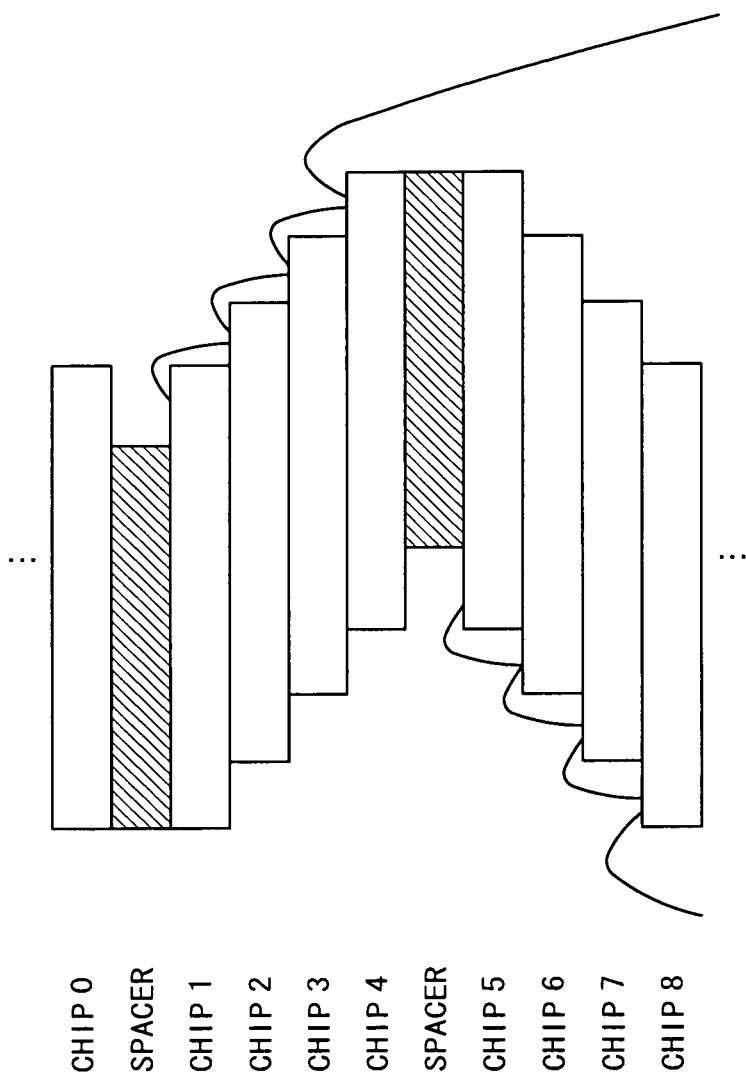

F I G. 13
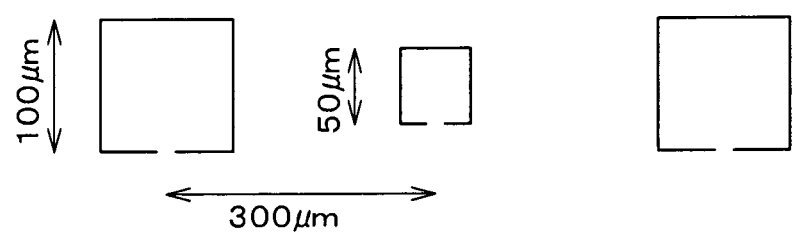

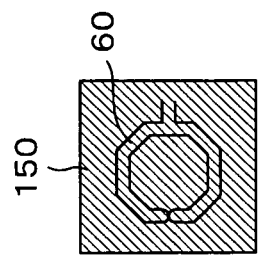
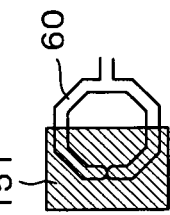
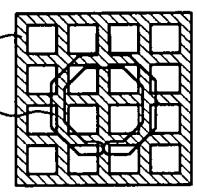
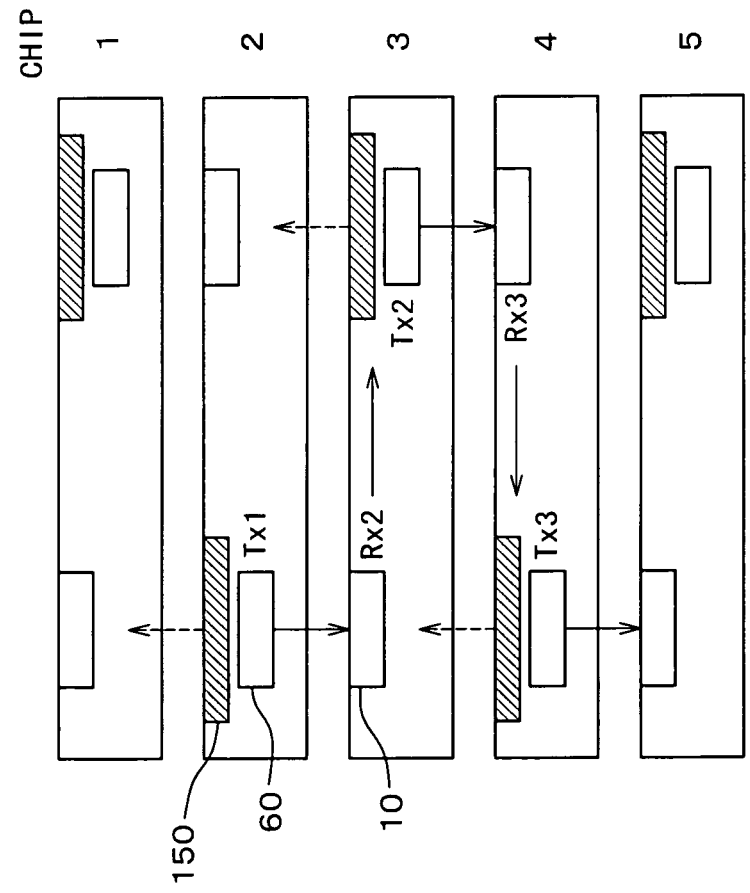
FIG. 16A
FIG. 16B
FIG. 16C
FIG. 16D

F I G. 17
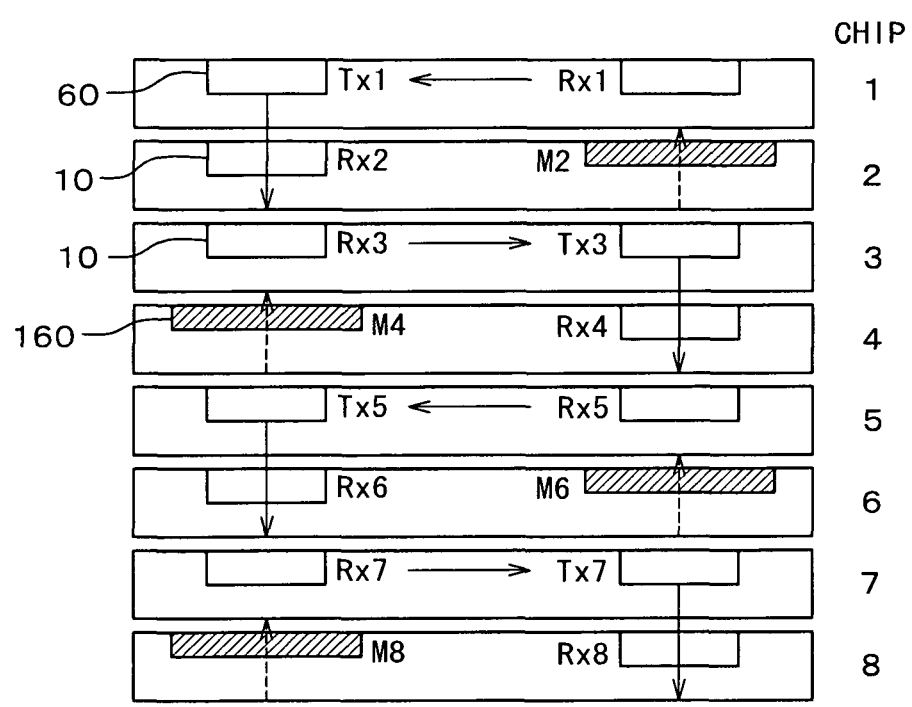

F I G. 19
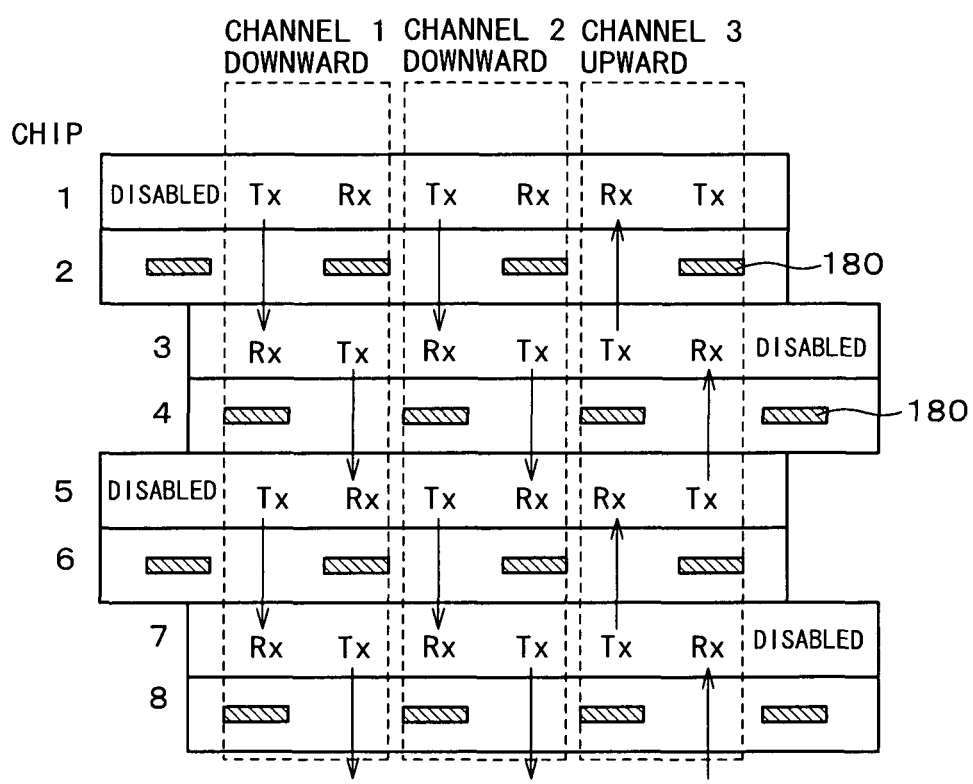

HEADER : 1001

PAYLOAD : 001101110100110011010100011110100

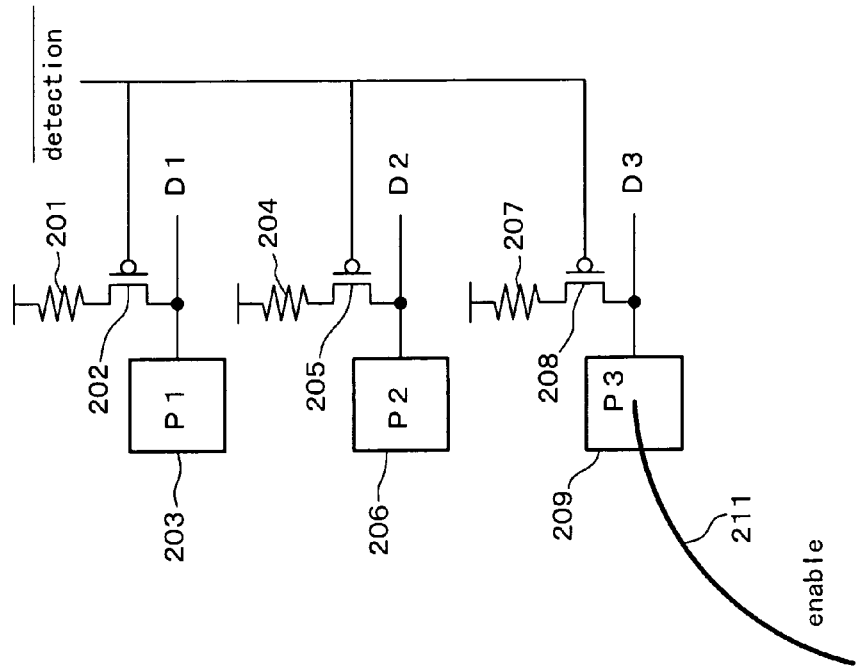
FIG. 34B
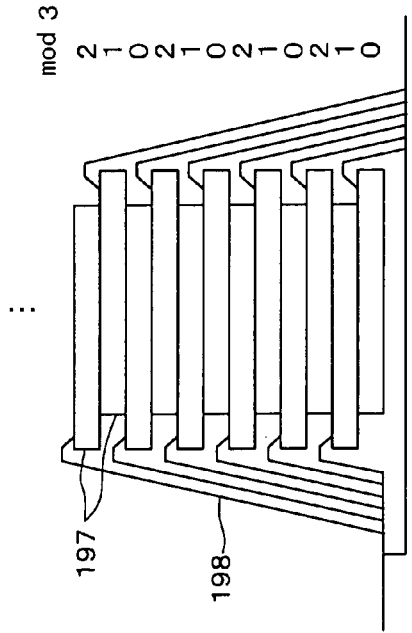
FIG. 34A
FIG. 34C

INDUCTIVE RELAYED COUPLING CIRCUIT BETWEEN SUBSTRATES

TECHNICAL FIELD

The present invention relates to an electronic circuit capable of suitably carrying out communications between substrates such as IC (Integrated Circuit) bare chips to be stacked.

BACKGROUND ART

The present inventors have proposed an electronic circuit that carries out communications by inductive coupling between chips to be stacked and mounted via coils formed by on-chip wiring of LSI (Large Scale Integration) chips (refer to Patent Literatures 1 to 7, and Non Patent Literatures 1 to 3).

CITATION LIST

Patent Literature

[Patent Literature 1] JP 2005-228981 A
[Patent Literature 2] JP 2005-348264 A
[Patent Literature 3] JP 2006-050354 A
[Patent Literature 4] JP 2006-066454 A
[Patent Literature 5] JP 2006-105630 A
[Patent Literature 6] JP 2006-173986 A
[Patent Literature 7] JP 2006-173415 A

Non Patent Literature

[Non Patent Literature 1] D. Mizoguchi et al, "A 1.2 Gb/s/pin Wireless Superconnect based on Inductive Inter-chip Signaling (IIS)," IEEE International Solid-State Circuits Conference (ISSCC'04), Dig. Tech. Papers, pp. 142-143, 517, February 2004.
[Non Patent Literature 2] N. Miura et al, "Analysis and Design of Transceiver Circuit and Inductor Layout for Inductive Inter-chip Wireless Superconnect," Symposium on VLSI Circuits, Dig. Tech. Papers, pp. 246-249, June 2004.
[Non Patent Literature 3] N. Miura et al, "Cross Talk Countermeasures in Inductive Inter-Chip Wireless Superconnect," in Proc. IEEE Custom Integrated Circuits Conference (CICC'04), pp. 99-102, October 2004.

SUMMARY OF INVENTION

Technical Problem

The distance at which communications can be carried out by magnetic coupling is on the order of a coil diameter.

When the coil is increased in size, communications can be carried out at large distances. However, when the coil is increased in size, the coil is increased in inductance (L) and also increased in parasitic capacitance (C). Because the self-resonant frequency of the coil is inversely proportional to the one-half power of a product of L and C, the self-resonant frequency is reduced when the coil is increased in size. Because it is when the main frequency component of a signal exists in a frequency range not higher than the self-resonant frequency that communications can be carried out by magnetic coupling without intersymbol interference, the data transfer rate is reduced when the coil is increased in size. Therefore, the coil cannot be increased in size when high-speed data transfer is desired.

In view of the above-described problems, it is an object of the present invention to provide an electronic circuit, for which substrates such as chips are stacked, capable of transferring data at a high speed up to a distant substrate through communications by inductive coupling.

Solution to Problem

An electronic circuit according to a first aspect of the present invention comprises in a stacked manner: a substrate n (n represents one, of the substrates stacked in order from 1 to N (N is an integer that is N≥3), that is 1≤n≤N−2) including a transmitter which transmits a signal by inductive coupling; a substrate n+x (x is an integer that is 1≤x≤N−n−1) including a repeater which receives a signal transmitted from the transmitter or a signal relayed from another repeater and relays said received signal by inductive coupling; and a substrate n+y (y is an integer that is x<y≈N−n) including a receiver which receives a signal relayed from the repeater.

Moreover, in an electronic circuit according to a second aspect of the present invention, the substrate including the repeater has stacking position information of said substrate via a wire or in a manner stored in a memory.

Moreover, in an electronic circuit according to a third aspect of the present invention, the stacking position information is a remainder with a divisor of an integer of 2, 3, or 4 representing a stacking order of the substrate.

Moreover, an electronic circuit according to a fourth aspect of the present invention comprises at least two substrates n+x1, n+x2 (x1<x2) including the repeaters for relaying in order from the substrate n, wherein the transmitter transmits a communication signal, followed by the repeater of the substrate n+x1 relaying the communication signal, and the repeater of the substrate n+x2 relaying the communication signal, and then the transmitter transmits a next communication signal.

Moreover, in an electronic circuit according to a fifth aspect of the present invention, the transmitter, receiver, and repeater are all connected to a coil serving as an antenna, and perform inductive coupling communications via said coil.

Moreover, in an electronic circuit according to a sixth aspect of the present invention, the coil connected to the repeater is used for both transmission and reception.

Moreover, in an electronic circuit according to a seventh aspect of the present invention, a transmitting coil and a receiving coil connected to the repeater are arranged coaxially with each other.

Moreover, in an electronic circuit according to an eighth aspect of the present invention, to the repeater, a transmitting coil and a receiving coil are connected at such a distance so as not to interfere with each other.

Moreover, an electronic circuit according to a ninth aspect of the present invention comprises three or more substrates including the repeaters, wherein to each repeater, a transmitting coil and two receiving coils or two transmitting coils and a receiving coil are connected shifted in order for each substrate in three positions at such a distance so as not to interfere with each other.

Moreover, in an electronic circuit according to a tenth aspect of the present invention, the direction to relay data is switched by selecting either of the two receiving coils or selecting either of the two transmitting coils.

Moreover, in an electronic circuit according to an eleventh aspect of the present invention, the transmitter makes a current which is a predetermined current according to transmission data and which changes when the transmission data changes flow in a transmitting coil to which the transmitter is connected, and the receiver has hysteresis characteristics where a threshold value for detecting a signal received by a receiving coil to which the receiver is connected changes to an opposite polarity when a signal has been detected.

Moreover, in an electronic circuit according to a twelfth aspect of the present invention, the transmitter makes a pulse current having a polarity according to a change in transmission data flow in a transmitting coil to which the transmitter is connected, and the receiver has hysteresis characteristics where a threshold value for detecting a signal received by a receiving coil to which the receiver is connected changes to an opposite polarity when a second half of a bidirectional pulse has been detected.

Moreover, in an electronic circuit according to a thirteenth aspect of the present invention, the transmitter asynchronously transmits a timing pulse, and synchronously transmits data, and the receiver asynchronously receives a timing pulse, and synchronously receives data.

Moreover, an electronic circuit according to a fourteenth aspect of the present invention comprises three or more substrates including the repeaters, wherein with regard to a timing pulse, to each repeater, a transmitting coil and a receiving coil are connected shifted in order for each substrate in three positions at such a distance so as not to interfere with each other.

Moreover, in an electronic circuit according to a fifteenth aspect of the present invention, T2+τ2−T1≥Tsetup here, T1: Time required for data communication
T2: Time required for timing pulse communication
Tsetup: Setup time for data transmission
τ2: Receiving timing pulse delay time for securing setup time.

Moreover, in an electronic circuit according to a sixteenth aspect of the present invention, the transmitter receives a signal relayed by the repeater and compares the signal with a transmission signal to detect an error.

Moreover, in an electronic circuit according to a seventeenth aspect of the present invention, an enable signal to be sent to all the repeaters is transmitted by wire communication, and a disable signal to each individual repeater is transmitted by inductive coupling communication.

Moreover, in an electronic circuit according to an eighteenth aspect of the present invention, the stacking position information being a remainder with the divisor of 2, 3, or 4 is transmitted by wire communication to transmit the enable signal.

Moreover, in an electronic circuit according to a nineteenth aspect of the present invention, as a result of a magnetic material film being formed overlapping with a region where the transmitting coil exists, said transmitting coil is made to have inductive coupling with a receiving coil later in relay order larger than inductive coupling with a receiving coil earlier in relay order.

Moreover, in an electronic circuit according to a twentieth aspect of the present invention, as a result of a metal film being formed overlapping with a region where the transmitting coil exists, said transmitting coil is made to have inductive coupling with a receiving coil earlier in relay order smaller than inductive coupling with a receiving coil later in relay order.

Moreover, in an electronic circuit according to a twenty-first aspect of the present invention, the metal film, as a result of being formed overlapping with a part of the region where the transmitting coil exists, is adjusted in the degree of reduction in inductive coupling with a receiving coil earlier in relay order.

Moreover, an electronic circuit according to a twenty-second aspect of the present invention comprises a plurality of substrates for each of which a plurality of coils are linearly arranged along one side and a plurality of metal films are linearly arranged along a side facing said one side at intervals twice those of said coils, those substrates being stacked rotated by 180 degrees with respect to neighboring substrates to overlap the metal film every other coil, and with two of the substrates set as a pair, being stacked alternately shifted by the coil intervals in pairs in the direction of a line along with the coils and metal films are arranged.

Moreover, an electronic circuit according to a twenty-third aspect of the present invention comprises a substrate including a coil which communicates by inductive coupling with another stacked substrate and a repeater connected to said coil.

Advantageous Effects of Invention

According to the present invention, in an electronic circuit for which substrates such as chips are stacked, data can be transferred at a high speed up to a distant substrate through communications by inductive coupling.

Moreover, in the case of conventional wireless communication, signals are propagated in four directions without directivity, and thus for realizing a repeater, complex control using a physical layer of the first layer to a session layer of the fifth layer in the hierarchical model (OSI reference model) of a network structure is required, resulting in significant cost and processing time.

Also in magnetic coupling, signals are propagated in both surface directions of a coil. For example, when chips are stacked, and the chip performs a repeat transfer when transferring a signal received from an upper chip to a lower chip by repeat, the signal (hereinafter, this signal is referred to as a "repetition") goes around the chip and inputs to a receiver of itself too. Further, a signal (hereinafter, this signal is referred to as a "response") when the lower chip performs another repeat transfer of the transferred signal to a next lower chip is also input to the foregoing receiver. If such a "repetition" or "response" is understood as to be next data from the upper chip and again repeated, there is a problem that the "response" endlessly moves back and forth to continue a repeating operation, and thus new data cannot be transferred, but this problem is solved by the present invention. Alternatively, if new data and a "repetition" or "response" of the last data are simultaneously input to a receiver, there is a problem of degradation in the quality (S/N ratio) of a received signal, but this is solved by the present invention.

BRIEF DESCRIPTION OF DRAWINGS

FIG. 1A and FIG. 1B are views depicting a configuration of an electronic circuit according to Example 1.

FIG. 6 is a view depicting a configuration of a receiver according to Example 2.

FIG. 10 is a view depicting waveforms of respective signals of Example 3.

FIG. 11 is a view depicting a structure of an electronic circuit according to Example 4.

FIG. 13 is a view depicting the size and interval of coils that are arranged in Example 4.

FIG. 16A, FIG. 16B, FIG. 16C, and FIG. 16D are views depicting a structure of a modification of Example 6.

FIG. 17 is a view depicting a structure of an electronic circuit according to Example 7.

FIG. 19 is a view describing a structure of an electronic circuit according to Example 8.

FIG. 34A, FIG. 34B, and FIG. 34C are views depicting an example of a wiring structure of an enable signal of the present invention.

DESCRIPTION OF EMBODIMENTS

Figure 2A:
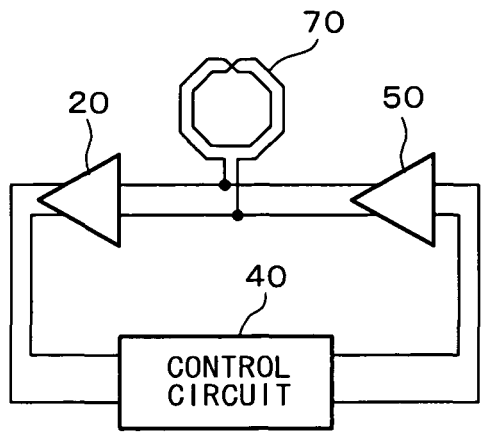
FIG. 2A, FIG. 2B, and FIG. 2C are views depicting arrangement examples of coils on chips.

Hereinafter, modes for carrying out the present invention will be described in detail with reference to the accompanying drawings.

Example 1

FIG. 1A and FIG. 1B are views depicting a configuration of an electronic circuit according to Example 1. Here, a repeater of one chip is shown. In actuality, the chip with this repeater arranged is stacked and mounted together with a chip with no repeater arranged. FIG. 1A is a view describing the repeater as a whole of the present example, and FIG. 1B is a view depicting a detailed circuit thereof. The repeater of the present example is composed of a receiver coil 10, a receiver 20, a control circuit 40, a transmitter 50, and a transmitter coil 60.

The receiver coil 10 generates a positive pulse voltage when a transmission signal Txdata of an upper or lower chip stacked and mounted at a corresponding position changes from low to high, and a negative pulse voltage when the transmission signal Txdata changes from high to low.

The receiver 20 is formed of an asynchronous receiver circuit composed of transistors 21, 22, and 27 to 33, inverters 23, 25, and resistors 24, 26. The receiver 20 forms a hysteresis comparator, which is composed of a gate circuit, a gain circuit, and a hysteresis circuit. The gate circuit is composed of transistors 21, 22, inverters 23, 25, and resistors 24, 26, and is capable of blocking a received pulse by a disable (stop) signal so that no signal is input to the receiver. The gain circuit is inverters composed of 'the transistors 27 and the transistor 28' and 'the transistor 29 and transistor 31', which amplify a pulse voltage VR input from the receiver coil 10. A received signal Rxdata is inverted when the pulse voltage VR exceeds a certain threshold value. The hysteresis circuit is formed of cross-coupled PMOS transistors 32, 33 connected to the output of the inverters. This circuit has a function of applying hysteresis to the above-mentioned threshold value, thereby enabling correctly restoring digital data from the pulse voltage VR. This hysteresis circuit changes the threshold value of an input inverter according to holding data. A dotted line shown in the VR waveform of FIG. 4 indicates a change in threshold value of the inverter composed of the transistor 27 and the transistor 28. In the initial state, the hysteresis circuit that holds a low received signal Rxdata raises the threshold value of the inverter. The received signal Rxdata is inverted to be high when a positive pulse is input to the input and exceeds this threshold value. The hysteresis circuit then reduces the threshold value of the inverter, and holds the received signal Rxdata until a negative pulse voltage exceeding the threshold value is input next. Repeating this allows correctly restoring digital data from the positive and negative pulse voltages.

Here, the control circuit 40 performs control so that this electronic circuit functions as a repeater. Moreover, the control circuit 40 can also perform control so that this electronic circuit functions as a transmitter that transmits data or a receiver that receives data, and can also perform control to switch the function among the repeater, transmitter, and receiver, if necessary. Further, the control circuit 40 performs control to switch the transmitter and/or receiver to enable (operation) and disable. Moreover, when a coil is used for both transmission and reception, the control circuit 40 performs control to switch a connection between the coil and the transmitter or receiver.

The transmitter 50 is formed of an asynchronous transmitter circuit composed of transistors 51 to 54. These are directly driven by a transmission signal Txdata to allow a transmission current IT having the same waveform shape as that of the transmission signal Txdata to flow through the transmitter coil 60.

The transmitter coil 60 is driven by the transmitter 50 to generate an induced magnetic field for data transmission.

Figure 2B:
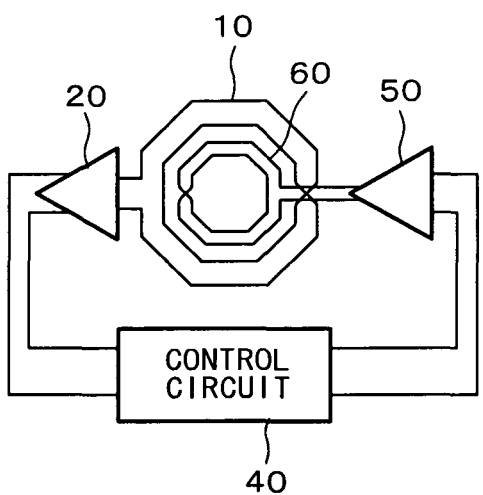
Figure 2C:
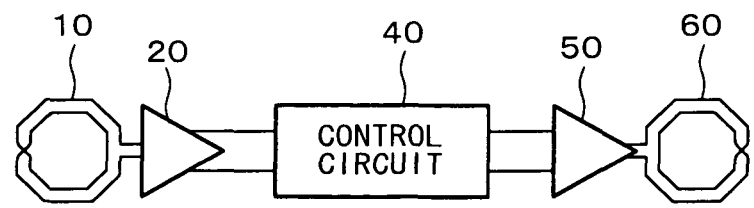

FIG. 2A, FIG. 2B, and FIG. 2C are views depicting arrangement examples of coils on chips. FIG. 2A depicts an example where a transmitter and receiver coil 70 serves as both a transmitter coil and a receiver coil, FIG. 2B depicts an example where the receiver coil 10 and the transmitter coil 60 are coaxially arranged, and FIG. 2C depicts an example where the receiver coil 10 and the transmitter coil 60 are arranged at positions separated from each other. In FIG. 2A, the same coil is used both for reception and for transmission by switching based on time. In FIG. 2B, the receiver coil 10 that is set larger and the transmission coil 60 that is set smaller are coaxially arranged. In FIG. 2C, it is desirable that the transmitter coil 60 and the receiver coil 10 are separated from each other so that a signal transmitted by the transmitter coil 60 is received small to an extent that can be ignored can be disregarded by the receiver coil 10. FIG. 2A and FIG. 2B allow a smaller layout area than that of FIG. 2C, but it must be noted that a repeated transmission strongly affects the receiver. The present invention can be realized with any of these arrangements.

Figure 3:
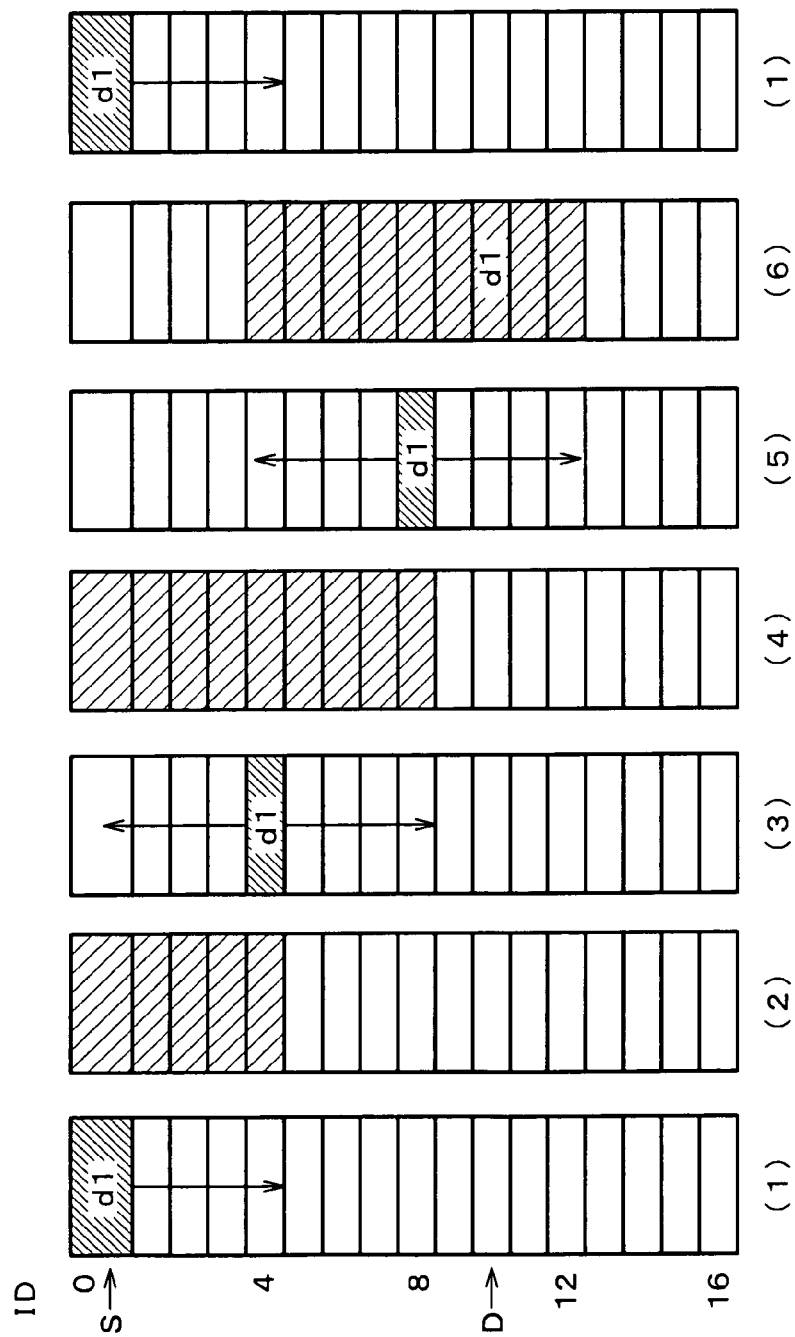
FIG. 3 is a view describing the operation of Example 1.

FIG. 3 is a view describing the operation of Example 1. FIG. 3 depicts a state of propagation of a signal at points (1) to (6) in time where 16 memory chips are stacked under a control chip (ID=0). Here, it is assumed that communication reaches up to upper and lower four chips each (a total of eight chips). For example, the control chip is assumed as a communication source (S meaning Source), and the tenth memory chip, as a communication destination (D meaning Destination).

First, the control chip performs transmission at (1). Next, memory chips 1 to 4 perform reception at (2). Memory chip 4 retransmits (repeats) that data at (3). The control chip and memory chips 1 to 8 perform reception at (4). Next, when memory chip 8 retransmits that data at (5), memory chips 4 to 12 perform reception at (6), and thus the data is received by chip 10 being a communication destination. By doing as described above, no matter how many chips are stacked, data can be transferred up to the destination with repeated retransmissions (repeats). The point (1) in time can follow the point (6) in time.

Figure 4:
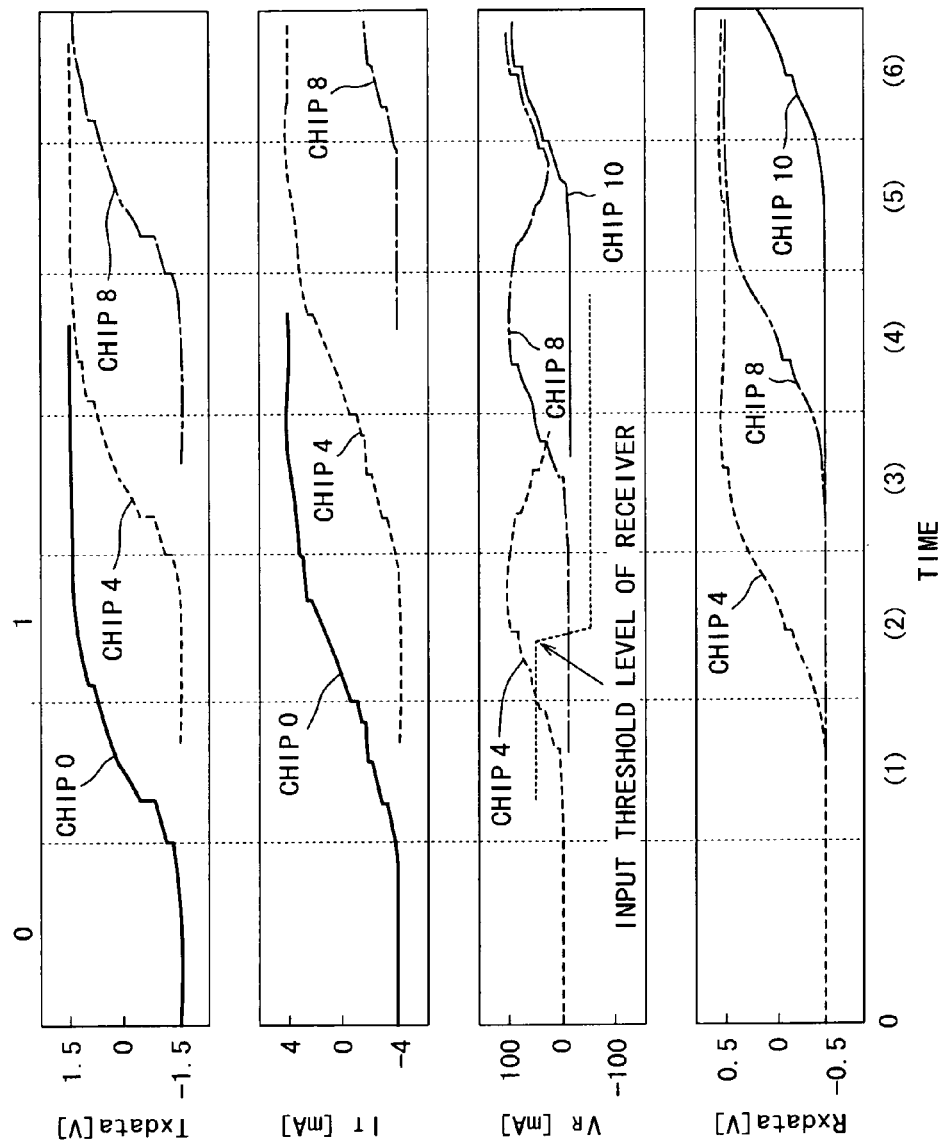
FIG. 4 is a view depicting waveforms of respective signals of Example 1.
Figure 5:
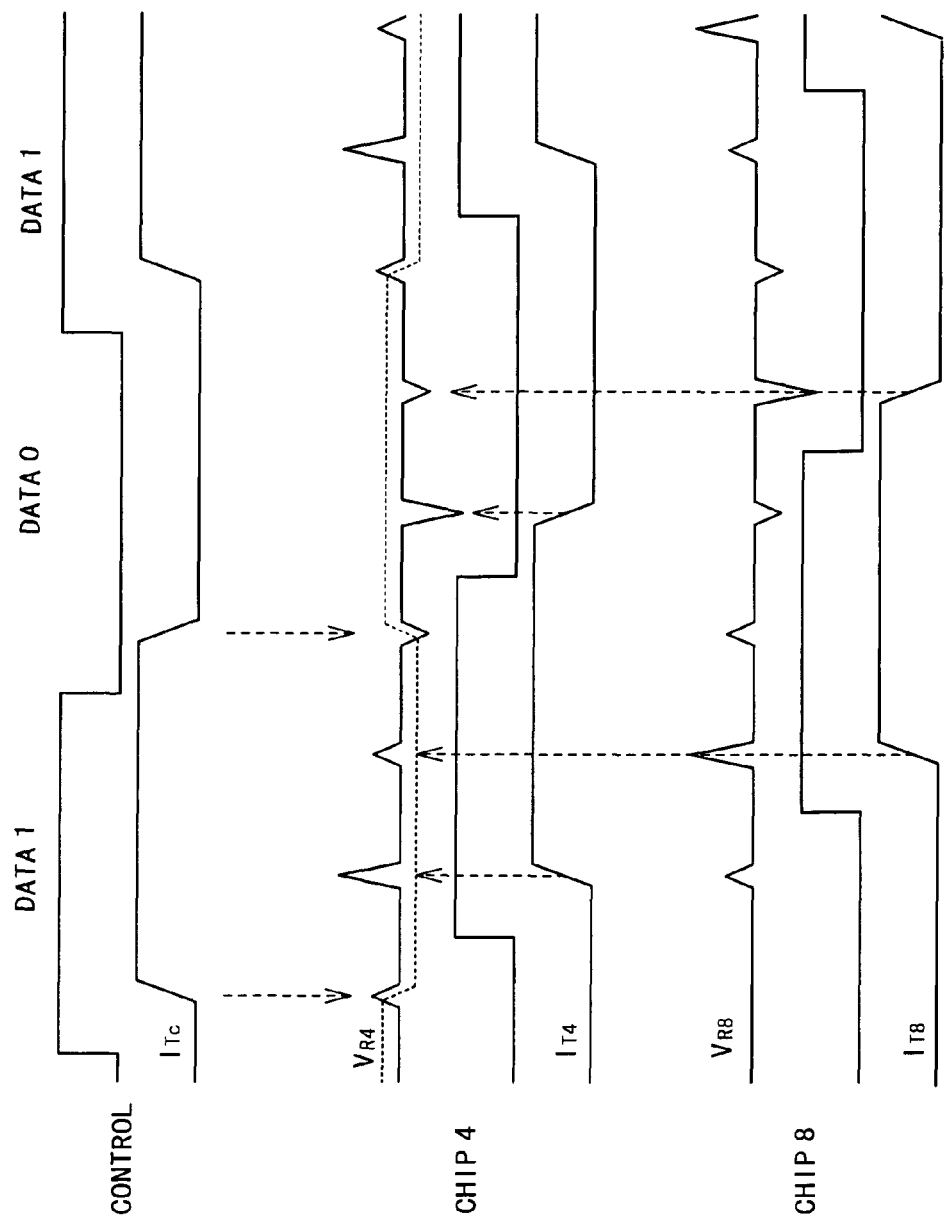
FIG. 5 is a view depicting waveforms of respective signals of Example 1.

FIG. 4 and FIG. 5 are views depicting waveforms of respective signals of Example 1. FIG. 4 depicts waveforms at points (1) to (6) in time of a transmission signal Txdata, a transmission current IT flowing through the transmitter coil, a received voltage VR generated in the receiver coil, and a received signal Rxdata. FIG. 5 depicts a mutual relationship among data, transmission signals, and received voltages of the control chip and chips 4 and 8. The point that must be noted is, for example, that the receiver coil of chip 4 receives the same data three times: first, where the receiver coil has received transmission data from the control chip at (2); and next, where the receiver coil has received the data retransmitted by chip 4 up close at (4) ("response" signal). Therefore (FIG. 4 is not accurate, but as shown in FIG. 5), a received signal voltage at (4) is larger than that at (2) (however, when the transmitter coil is placed separated far from the receiver coil in the case of FIG. 2C, reception of the repeat signal can be reduced by that much). Then, the third time is where the receiver coil has received the data retransmitted by chip 8 at (6) (can be compared just like a person hearing an echo of his/her own voice) ("response" signal). This is the same received signal voltage as that at (2).

The same data is thus repeatedly received, but immediately after having received new data Dm (new data is 1 where previous data is 0), in preparation for receiving the following new data Dm+1 (Dm+1 is 0 where Dm is 1), the input threshold value of the receiver (hysteresis circuit) changes as shown by a dotted line in the figure, and thus the receiver has no change in output even when having received the same signals (repeat and "response") as the received data two times in a row as described above.

Here, the repeat and "response" signals both must have the same polarity as that of the data signal. For example, when the direction in which the transmitter coil is wound is opposite to that in which the receiver coil is wound, or when the transmitter is designed so that a current in the opposite direction flows even when the direction in which the coil is wound is the same, the repeat and "response" signals are inverted by a repeating operation. As a result, digital signal values are inverted at every time of retransmission by a repeater, so that data cannot be correctly transferred.

In addition, memory chip 12 thus receives data, but does not perform a repeating operation, because memory chip 12 is located beyond the communication destination chip 10.

Moreover, the control chip receives repeated and returned data at (4), and thus whether a repeating operation has been correctly performed can be verified by comparing with data transmitted at (1). Similarly, chip 4 receives at (6) data transmitted at (3), and thus a repeating operation can be verified. When an error is detected, a notification to that effect is made to again transmit data.

The control chip that can transmit next data is after (6) ends. This is because, if the control chip transmits new data at (5), data retransmitted by chip 8 and data transmitted by the control chip collide with each other at (6) in the receiver coil of chip 4, and communications cannot be correctly performed. That is, by repeating the operation from (1) to (6), data strings can be transferred one after another from S to D.

D corresponds to chip 10 in this example and chip 12 does not perform a repeating operation, but chip 12 performs a repeating operation at (7) (not shown) when D corresponds to chip 15, for example. However, because its signal reaches only up to chip 8 at (8) (not shown), even when the control chip transmits new data at (7) and the data reaches chip 4 at (8), there is no chance of collision with the last data in chip 4.

In the case of a coil arrangement of FIG. 2A, because the receiver directly inputs an output signal of the transmitter, a large received signal is generated in the receiver coil at the time of "repetition". Moreover, also in the case of FIG. 2B, because the receiver coil and the transmitter coil have strong magnetic coupling therebetween, a large received signal is generated in the receiver coil at the time of "repetition". Because a capacitance component is also parasitic in the coil, the received signal may fluctuate due to the inductance and capacitance, and the second received signal in FIG. 4 and FIG. 5 fluctuates also to the negative polarity, which can cause malfunction. Such a problem can be solved by the control circuit disabling the receiver so as to prevent reception at "repetition". When the disable signal becomes low, a signal from the receiver coil is not input to the receiver.

Example 2

FIG. 6 is a view depicting a configuration of a receiver according to Example 2. The receiver of the present example is composed of transistors 27 to 33 and 71 to 74 and NAND circuits 75, 76. The channel width and the channel length of the NMOS transistor 72 and PMOS transistor 71 are designed so as to be equal in ratio to or the same size as those of the NMOS transistors 28 and PMOS transistor 27 and the NMOS transistor 31 and PMOS transistor 29. This allows amplifying a minute received signal generated in the coil at high sensitivity.

The NMOS transistor 72 is turned on when a disable signal is low, the output and input of the transistors 73, 74 are connected by on-resistance of the NMOS transistor 72, and the potential in the center of the coil is biased to a potential where the receiver has the maximum input sensitivity to enable signal transmission. When the disable signal is high, inputs of the receiver both become low because the NMOS transistor 72 is turned off and the PMOS transistor 71 is turned on, and a direct current of the receiver is cut. Both outputs of the receiver become high at this time, and former data is held in a latch composed of the subsequent NAND circuits 75, 76. The method for disabling a receiver in FIG. 1 has an advantage to allow quick revival to signal transmission, but has a drawback of consuming direct-current power even when the receiver has been disabled. By disabling the receiver as in the present example, direct-current power of the receiver can be cut. Standby energy can be reduced in the receivers of chips not involved in a repeating operation.

Figure 7:
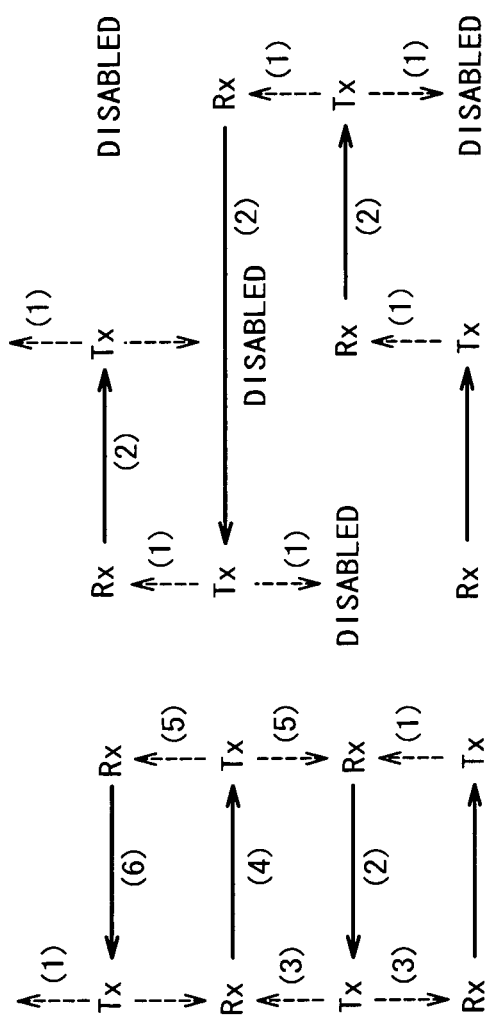
FIG. 7A and FIG. 7B are views depicting arrangement examples of coils between chips.

FIG. 7A and FIG. 7B are views depicting arrangement examples of coils among chips when the coils are arranged as in FIG. 2C. FIG. 7A depicts an example where a transmitter coil Tx and a receiver coil Rx are arranged in the position of two points alternately for each repeater chip, and FIG. 7B depicts an example where a transmitter coil Tx and a receiver coil Rx are arranged in the position of three points shifted in order for each repeater chip. Hereinafter, a chip on which a repeater is arranged is sometimes referred to as a repeater chip.

As in the example shown in FIG. 7A, when the receiver coil Rx of an upper chip is arranged at a position coaxial with the transmitter coil Tx of a lower chip, and the transmitter coil Tx of the upper chip is arranged at a position coaxial with the receiver coil Rx of the lower chip, a repeat signal returns as a "response" in the same manner as the foregoing description.

This problem can be solved by performing control so that the receiver no longer operates by the time a "response" returns. However, due to timing control covering a plurality of chips, an undesirable effect such as slowing of the data transfer rate can also occur.

Meanwhile, as shown in FIG. 7B, when an upper chip on the transmitter coil Tx has the receiver coil Rx to be paired therewith arranged, and the transmitter coil Tx of the upper chip is arranged separated far (to an extent of twice or more the thickness of the upper chip) from the receiver coil Rx of the lower chip, retransmitted data does not return to the lower chip, and thus the lower chip may even transmit next data at a stage of (3) in FIG. 3. Therefore, high-rate data transfer can be easily performed.

Example 3

Figure 8:
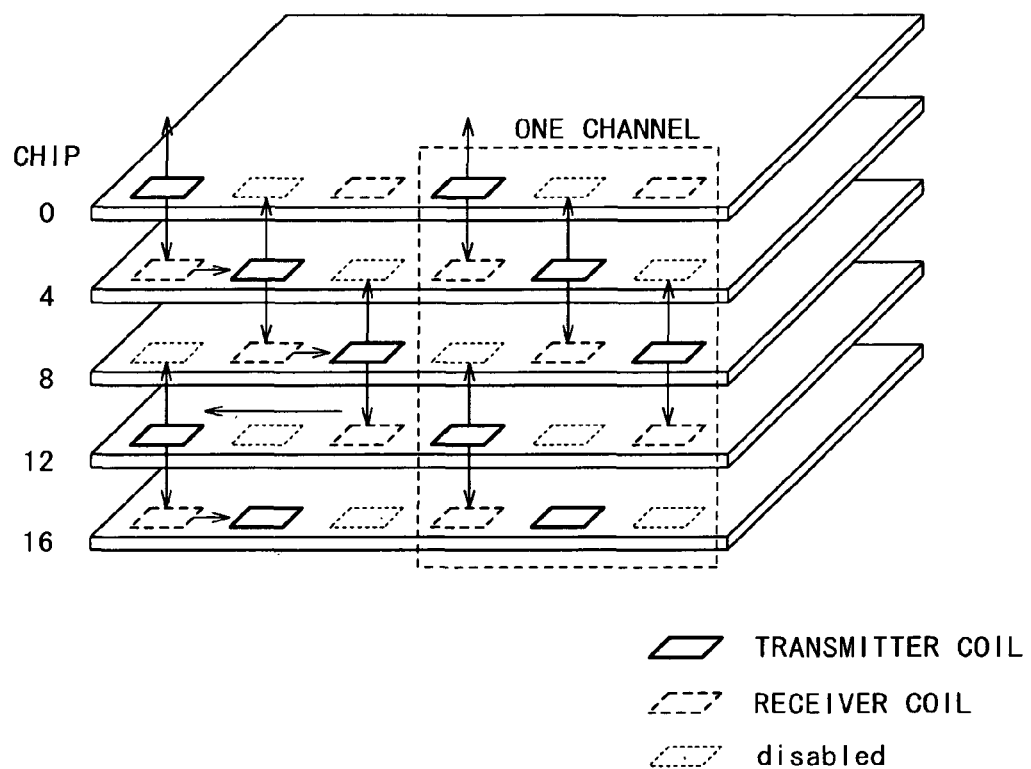
FIG. 8 is a view depicting a structure of an electronic circuit according to Example 3.

FIG. 8 is a view depicting a structure of an electronic circuit according to Example 3. For example, by, as shown in FIG. 8, forming one communication channel with use of three sets of coils, data can be transmitted one after another without keeping the data waiting, so that the data transfer rate can be increased. A triple chip area is instead required. The three sets of coils can be programmed for any of transmission use, reception use, and unused (disabled) by use of bonding wiring, an EEPROM, or the like. For example, in the case of FIG. 8, three types of programming are required according to the stacking position of the chip. By using two bonding wires, and making a distinction based on whether each thereof is connected to a power supply potential or a ground potential, four combinations can be created, and thus information concerning the stacking position of the chip can be imparted to the chip at a mounting stage of the chip. Alternatively, by writing HIGH or LOW in two bits of the EEPROM loaded on the chip, four combinations can still be created, and thus information concerning the stacking position of the chip can be imparted to the chip at a test stage prior to mounting of the chip.

Figure 9:
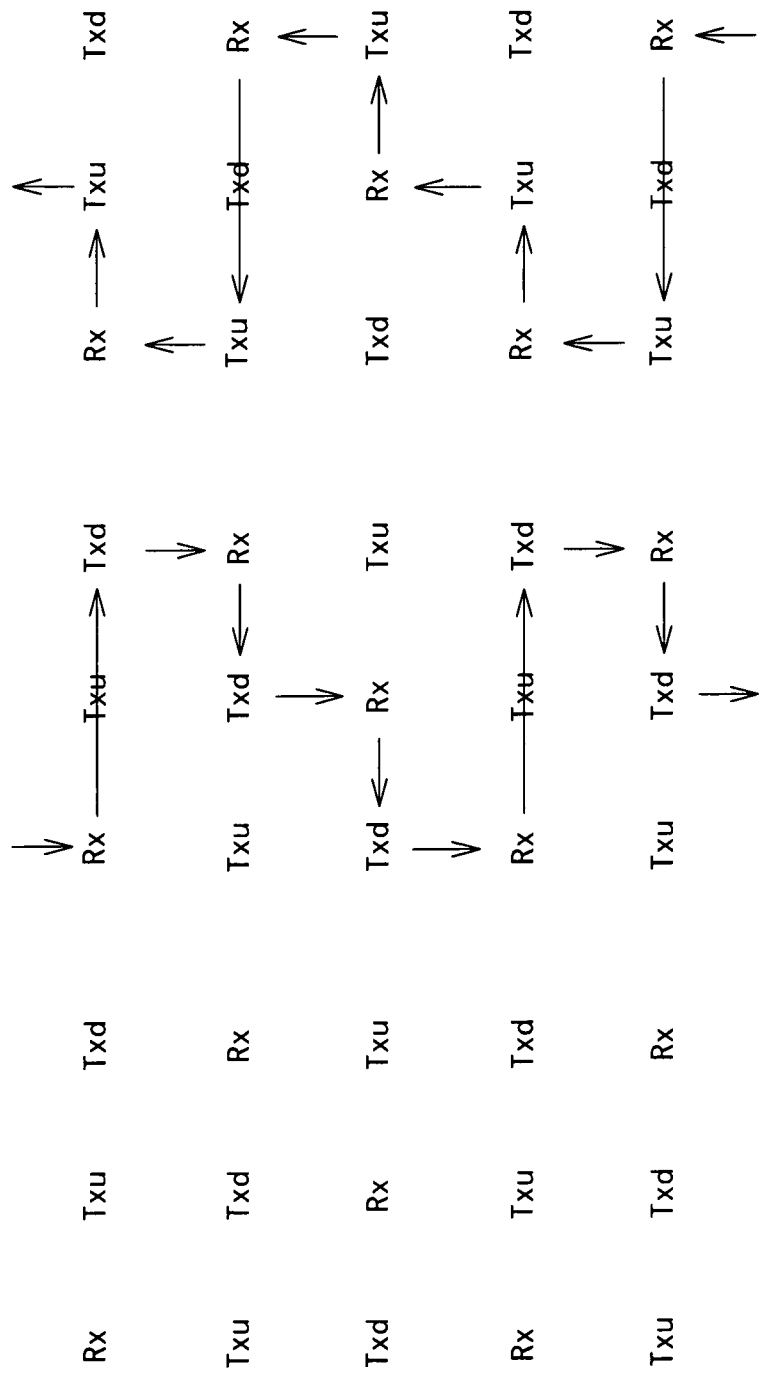
FIG. 9A, FIG. 9B, and FIG. 9C are views depicting detailed embodiments of an electronic circuit according to Example 3.

FIG. 9A, FIG. 9B, and FIG. 9C are views depicting detailed embodiments of an electronic circuit according to Example 3. A receiver coil Rx, a downward repeating transmitter coil Txd, and an upward repeating transmitter coil Txu are arranged according to the stacking order of the chip. For example, in the case of FIG. 9A, there are three arrangement patterns provided so that 'the first and the fourth' and 'the second and the fifth' from the bottom respectively become the same.

As shown in FIG. 9B, by operating the Txd, disabling the Txu, and inputting an output from Rx to the Txd via a control circuit, a downward repeating operation can be realized. Moreover, as shown in FIG. 9C, by operating the Txu, disabling the Txd, and inputting an output from Rx to the Txu via a control circuit, an upward repeating operation can be realized. By thus using either of the two coils Tx, a downward repeating operation and an upward repeating operation can be easily realized.

Here, an example of combining one receiver coil and two transmitter coils has been mentioned, but the same effect can be provided on the same principle by combining one transmitter coil and two receiver coils and selectively operating the receiver coils. Specifically, it suffices to replace, for example, the Rx in FIG. 9 with Tx, and the Txu and the Txd, with Rxu and Rxd, respectively.

One communication channel has been formed with use of three sets of coils in the above description. Inductive coupling must be sufficiently large between coils where communication is required, while inductive coupling must be sufficiently small between coils where communication is not required. In consideration also of manufacturing production tolerance and the like, for further putting flexibility in operation, it is necessary to make the distance between the transmitter coil of an upper chip and the receiver coil of a lower chip farther. For example, one communication channel may be formed with use of four sets of coils. Although description will be omitted because the concept is completely the same with only an increase in the number of coils, this is within the scope of the present invention.

FIG. 10 is a view depicting waveforms of respective signals of Example 3. FIG. 10 depicts time-series waveforms of a transmission voltage Txdata, a transmission current IT, a received voltage VR, and a received signal Rxdata. By repeating such signal propagation and transmission, data sequences can be transferred from S to D.

Example 4

FIG. 11 is a view depicting a structure of an electronic circuit according to Example 4. For the present example, a plurality of chips are stacked shifted in order, a spacer is interposed, and then a plurality of chips are stacked shifted in order in the other direction, and this process is repeated. As shown in FIG. 11, by shifting while stacking a plurality of chips, a chip can be wire-bonded in a position where another chip exists thereunder, and thus an impact applied by bonding to the chip is relaxed, and the chip is improved in endurance, so that there is an advantage that the chip can be reduced in thickness. In contrast, when chips are stacked alternately shifted as shown in, for example, FIG. 18B, because a chip is bonded where another chip does not exist thereunder, and thus even when a bonding impact is slight, the chip is likely to be damaged, so that it becomes relatively difficult to reduce the chip in thickness. Moreover, it also becomes possible to link wire bonding supplied to each chip efficiently from one chip to another like a power line, and there is also an advantage that wire bonding can be more efficiently performed in a limited space. On the other hand, for creating a space for wire bonding on, for example, chip 5, it is necessary to insert a spacer made of silicone or the like between chip 4 and chip 5, and the regularity is therefore lost (as to be described below).

Figure 12A:
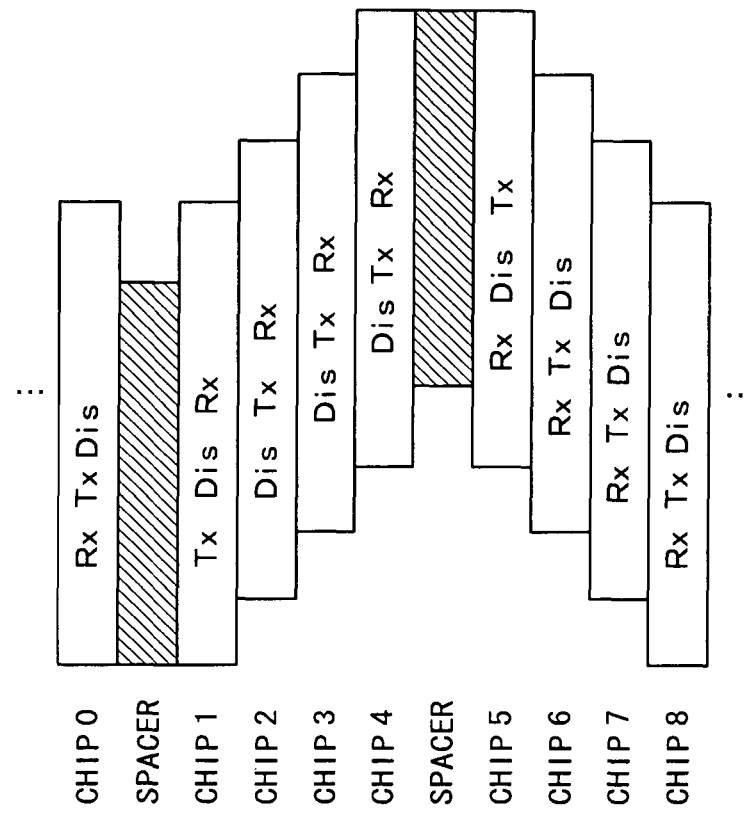
FIG. 12A and FIG. 12B are views depicting arrangement examples of coils of an electronic circuit according to Example 4.
Figure 12B:
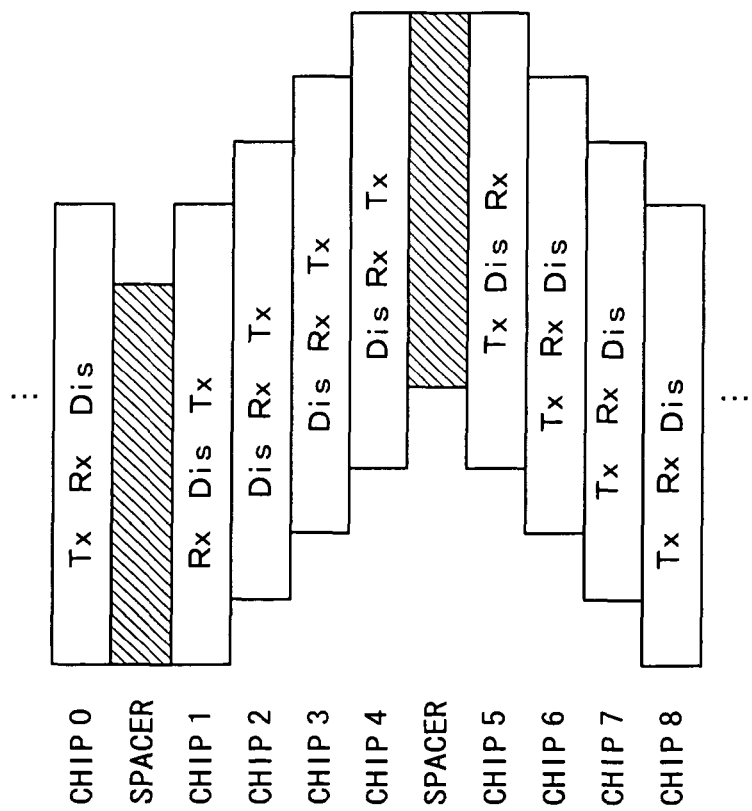

FIG. 12A and FIG. 12B are views depicting arrangement examples of coils of an electronic circuit according to Example 4. FIG. 13 is a view depicting the size and interval of coils arranged in Example 4. FIG. 12A and FIG. 12B depict examples where, when chips are thus stacked, one communication channel is formed with use of three sets of coils as shown in Example 3. FIG. 12A depicts a case where a downward repeating operation is realized, and FIG. 12B depicts a case where an upward repeating operation is realized. Moreover, FIG. 13 depicts an example of the size and interval of the three sets of coils. The numerals are a representative example, and not limited to these.

When FIG. 12A and FIG. 12B and FIG. 9A, FIG. 9B, and FIG. 9C are compared with each other, these are common in that a downward or upward repeating operation can be realized by programming three sets of coils for any of transmission use, reception use, and unused (disabled) according to the stacking order of the chip. The programming can be carried out in the same manner as Example 3 by using bonding wiring, an EEPROM, or the like.

FIG. 12A and FIG. 12B are different from FIG. 9A, FIG. 9B, and FIG. 9C in that the way of programming the coils changes only next to the spacers, and the same programming is provided in other chips.

Further, there is a difference in that, between chips with a spacer interposed, for example, between chip 4 and chip 5, or between chip 0 and chip 1, the communication distance is extended to twice as long as that in other cases. Accordingly, coils at both sides among the three coils are designed to be approximately twice as large as the middle coil, so as to have a double communication distance. In this case, a transmission signal of chip 1 may reach chip 3 or 4, for example, but no problem occurs because no receiver coil exists there.

The reason for not designing the middle coil large is to prevent crosstalk from occurring between, for example, chip 3 and chip 5 (a distance corresponding to three chips). If the middle coil is also designed with the same size as that of the coils at both sides, transmission and reception at a distance of two chips is made possible also in the middle coil, and thus the transmitter coil of chip 5 can cause crosstalk to the receiver coil of chip 3 in FIG. 12A (likewise in FIG. 12B, the transmitter coil of chip 3 can cause crosstalk to the receiver coil of chip 5), for example. Alternatively, for making this crosstalk sufficiently small, having also for both ends the same small coils as in the middle ready, and using the larger coils for a distance of two chips, and the smaller coils, for a distance of one chip, provides higher reliability. Having two types of coils ready and using these according to the distance can be easily carried out by simply adding a switching transistor to a transmitter circuit.

Example 5

Figure 14B:
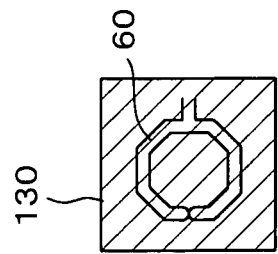
FIG. 14A and FIG. 14B are views depicting a structure of an electronic circuit according to Example 5.
Figure 14A:
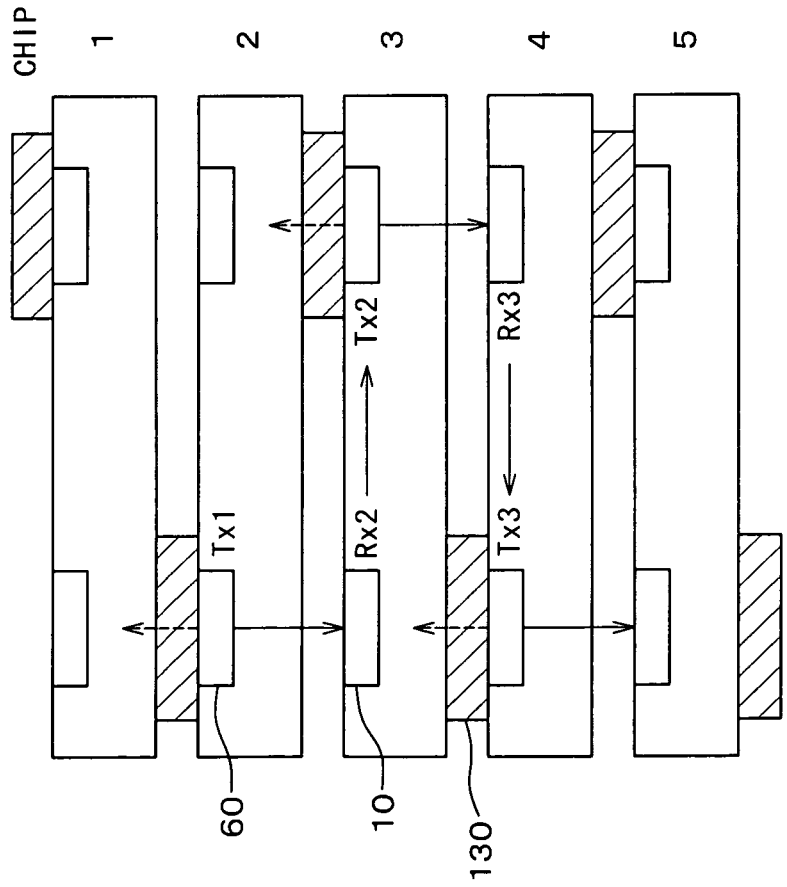

FIG. 14A and FIG. 14B are views depicting a structure of an electronic circuit according to Example 5. In order to prevent retransmitted data from returning to its original chip, there is provided not only a method for securing a large distance by increasing the number of coils, but also a method for enhancing a magnetic field by using a magnetic material, and for attenuating a magnetic field by using metal wiring. When a magnetic material film 130 made of a magnetic material is arranged overlapping with a region where a transmitter coil 60 and a receiver coil 10 exist as shown in FIG. 14A and FIG. 14B, inductive coupling between the transmitter coil 60 and the receiver coil 10 (for example, Tx1 and Rx2) can be enhanced where inductive coupling is required. As a result, even the configuration as in FIG. 7A allows repeat transfer, and the number of required coils can be reduced from three sets to two sets. Here, the above-mentioned effect is great when the magnetic material has magnetic permeability in the horizontal direction to the chip sufficiently greater than that in the vertical direction to the chip. Moreover, the shorter the distance between the coil and the magnetic material film, the greater the effect.

Example 6

FIG. 15A, FIG. 15B, FIG. 15C, and FIG. 15D are views depicting a structure of an electronic circuit according to Example 6. The present example is an example of attenuating a communication signal by using metal wiring, and a metal film 140 is arranged overlapping with a region where a transmitter coil 60 and a receiver coil 10 exist. An eddy current flows in the metal film 140 to cancel out a change in the magnetic field, so that magnetic coupling is attenuated. For example, when an Rx2 coil is formed of a sixth wiring layer, and a blocking pattern is formed of a first wiring layer, (As a matter of course, the sixth layer and the first layer are an example, and other layers having the same vertical relationship may be used. The shorter the distance therebetween, the greater the attenuation effect with, for example, the fourth layer and the third layer, not the sixth layer and the first layer), coupling from the Tx3 to the Rx2 can be reduced. In this case, coupling from the Tx1 to the Rx2 also declines, which thus requires attention. By an electromagnetic field analysis simulation performed with, for example, a distance between the metal film 140 and the receiver coil 10 of 1 μm, a distance between the transmitter coil 60 and the receiver coil 10 of 50 μm (this corresponds to a case with use of the fourth layer and the third layer), a diameter of the transmitter/receiver coil of 50 μm, and a diameter of the metal film 140 of 100 μm, it has been confirmed that, as a result of insertion of the metal film 140, coupling between the Tx3 and the Rx2 where inductive coupling is not required can be largely reduced to 0.01 times of its original coupling.

Moreover, it has also been confirmed that coupling between the Tx1 and the Rx2 where inductive coupling is required is also reduced to 0.3 times of its original coupling.

More specifically, the coupling between the Tx1 and the Rx2 should be enhanced to such an extent to enable communication, and the coupling between the Tx3 and the Rx2 should be attenuated to such an extent not to cause interference. This adjustment can be carried out by changing the distance between the metal film and the receiver coil. With use of, for example, the sixth layer and the first layer, not the fourth layer and the third layer, the distance therebetween is extended, and the coupling between the Tx1 and the Rx2 becomes larger than 0.3.

Figure 15B:
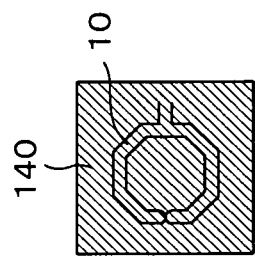
FIG. 15A, FIG. 15B, FIG. 15C, and FIG. 15D are views depicting a structure of an electronic circuit according to Example 6.
Figure 15C:
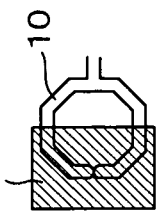

Alternatively, the adjustment can be carried out by increasing or reducing an overlapping area between a metal film 141 and the transmitter/receiver coil as shown in FIG. 15C. The larger the overlapping therebetween, the greater the blocking effect, and the more attenuated the coupling.

Figure 15D:
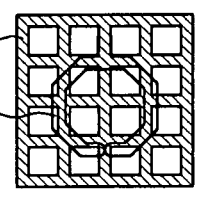
Figure 15A:
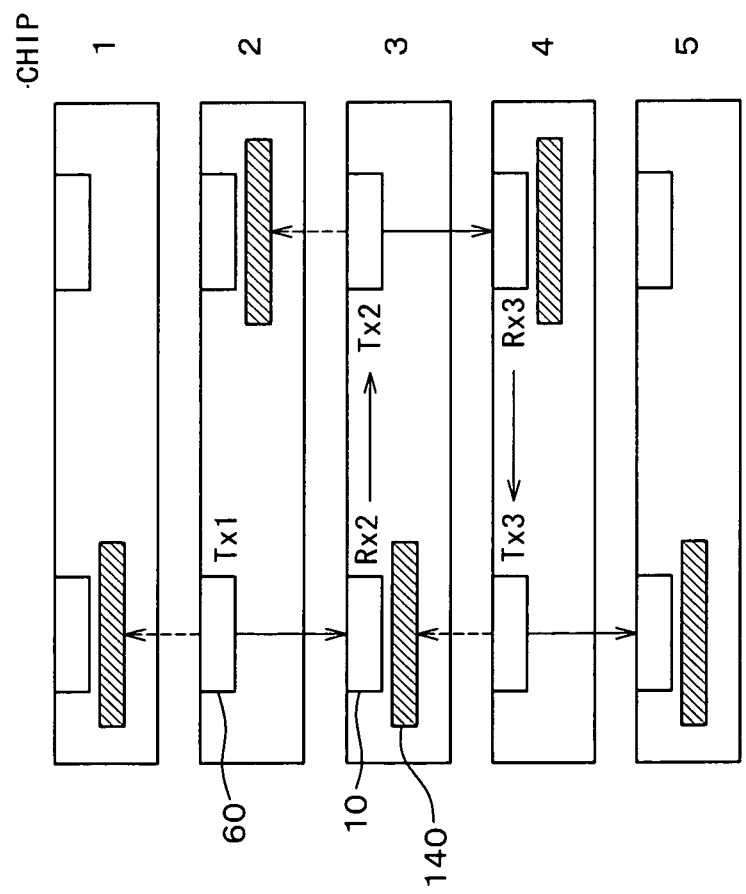

Still alternatively, the attenuation effect can be adjusted also by increasing or reducing an opening portion of a mesh pattern formed by a metal film 142 as shown in FIG. 15D. The smaller the opening portion, the greater the blocking effect, and the more attenuated the coupling.

FIG. 16A, FIG. 16B, FIG. 16C, and FIG. 16D are views depicting a structure of a modification of Example 6. For Example 6, the metal film 140 has been formed in an overlapping manner on the same substrate as with the receiver coil 10, while for the present modification, a metal film 150 is formed in an overlapping manner on the same substrate as with the transmitter coil 60. The same effects are obtained even when the metal film 150 being a blocking pattern is thus formed of, for example, a sixth wiring layer and the transmitter coil 60 is formed of a first wiring layer as such.

Moreover, Example 6 shown in FIG. 15 and FIG. 16 can be easily realized also by rotating by 180 degrees and shifting while stacking chips having the same structure. Therefore, the chips having the same structure can be stacked for a repeat transfer of data.

Example 7

FIG. 17 is a view depicting a structure of an electronic circuit according to Example 7. The present example, for which a metal film 160 for magnetic field attenuation is arranged in the middle of a transmitter coil 60 and a receiver coil 10, accordingly allows not largely reducing coupling where inductive coupling is required while largely reducing coupling where inductive coupling is not required. By an electromagnetic field analysis simulation performed with, for example, a distance between the metal film 160 and the receiver coil 10 and the transmitter coil 60 of 25 µm, a distance between the transmitter coil 60 and the receiver coil 10 of 50 µm, a diameter of the transmitter/receiver coil 10, 60 of 50 µm, and a diameter of the metal film 160 of 100 µm, it has been confirmed that, as a result of insertion of the metal film 160, coupling between the Tx5 and the Rx3 where inductive coupling is not required can be reduced to 0.05, while coupling between the Tx1 and the Rx3 where inductive coupling is required can be made to 0.8.

Further, it has also been confirmed by the electromagnetic field analysis simulation that the metal film for magnetic field attenuation is maximized in signal-to-noise ratio when the metal film is slightly larger than the transmitter/receiver coil.

Example 8

Figure 18A:
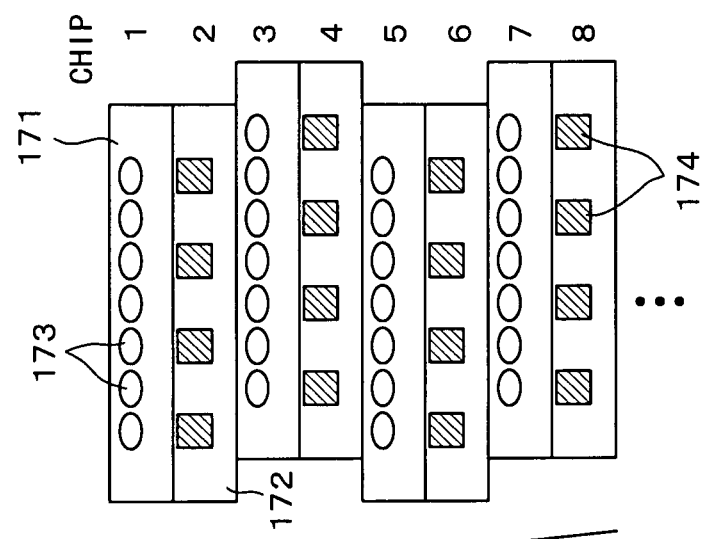
FIG. 18A, FIG. 18B, and FIG. 18C are views depicting a structure of an electronic circuit according to Example 8.
Figure 18B:
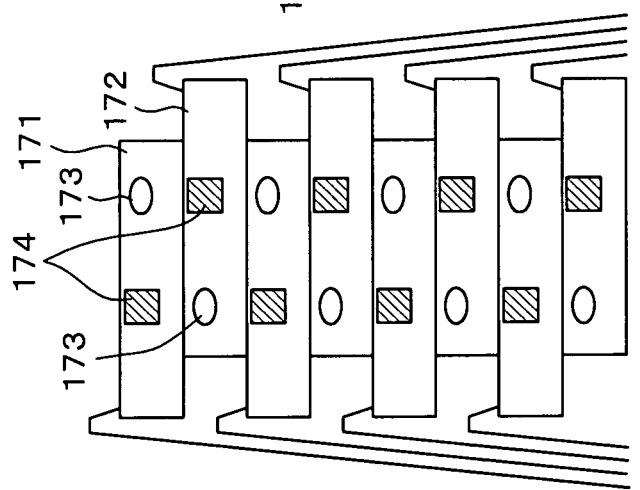
Figure 18C:
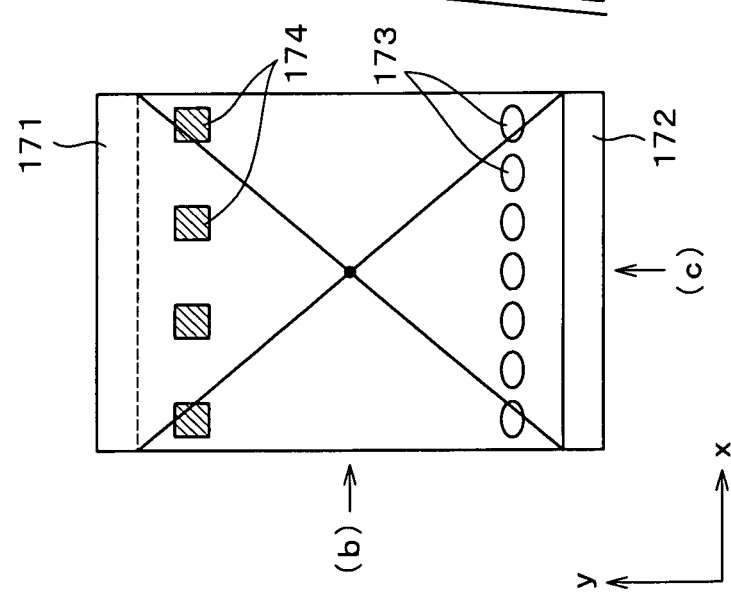

FIG. 18A, FIG. 18B, and FIG. 18C are views depicting a structure of an electronic circuit according to Example 8. FIG. 18A is a top view, FIG. 18B is a left side view, and FIG. 18C is a right side view. The present example, for which chips having the same structure are rotated by 180 degrees while being stacked shifted, thereby realizes a repeat channel. First, by rotating by 180 degrees while stacking a first substrate 171 being chip 1 having transmitter and receiver coils 173 in a line and metal films 174 in a line at intervals twice those of the transmitter and receiver coils 173 in a manner shifted in the y-direction with respect to a second substrate 172 being chip 2 having the same structure, each other's transmitter and receiver coils 173 and metal films 174 can be overlapped, and a space for bonding wiring can be secured, as shown in FIG. 18B. Chip 3 and chip 4 are stacked in the same manner. Then, by stacking chip 1 and chip 2 in a manner shifted by the coil interval in the x-direction with respect to chip 3 and chip 4 as shown in FIG. 18C, a repeating channel shown in FIG. 19 can be realized.

As shown in FIG. 19 (the same as FIG. 18C), by using one of the two transmitter and receiver coils for Tx and using the other for Rx (according to moment-to-moment situations), both of a downward repeating operation and an upward repeating operation can be realized in a manner varying from moment to moment. Transmission coils Tx, receiver coils Rx, and metal films 180 are shown.

When a plurality of repeat channels are arranged as in FIG. 19, interference between the transmitter coil Tx and the receiver coil Rx of neighboring channels in the same chip causes a problem, but this can be solved, when the transmitter coil Tx performs transmission, by disabling the neighboring receiver coil Rx.

In the case of an example shown in FIG. 19, the receiver coils Rx and the transmitter coils Tx of neighboring channels having the same repeating direction are adjacent to each other, but when the neighboring channels are synchronized in signal transmission and reception, it suffices to disable the Rx of the neighboring channels.

On the other hand, as shown in FIG. 19, at a boundary with a neighboring channel having an opposite repeating direction, two receiver coils Rx are adjacent to each other, and crosstalk with the transmitter coils Tx of chips disposed thereon and thereunder causes a problem. For example, the receiver coil Rx in channel 2 of chip 5 receives a signal from the transmitter coil Tx of chip 3 disposed directly thereabove, but a signal from the transmitter coil Tx in channel 3 of chip disposed obliquely therebelow can possibly interfere therewith. Likewise, the receiver coil Rx in channel 3 of chip 5 receives a signal from the transmitter coil Tx of chip 7 disposed directly therebelow, and a signal from the transmitter coil Tx in channel 2 of chip 3 disposed obliquely thereabove can possibly interfere therewith. However, it has been confirmed by an electromagnetic field analysis simulation that, as a result of insertion of the metal film 180 for magnetic field attenuation, crosstalk can be significantly reduced, and the array pitch of the coils can be reduced to about a half.

Figure 20:
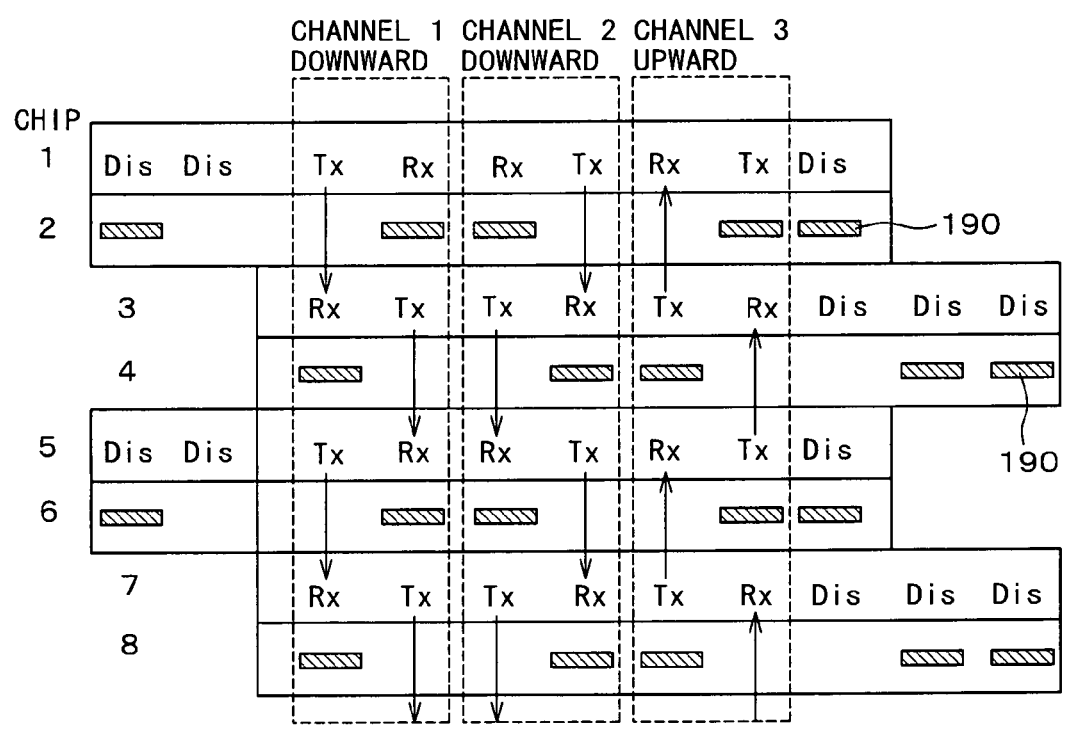
FIG. 20 is a view depicting a structure of a modification of Example 8.

Moreover, when a metal film 190 is arranged so as to overlap two coils each as in the example shown in FIG. 20, the receiver coils Rx and the transmitter coils Tx of neighboring channels having the same repeating direction can be prevented from being adjacent to each other.

Figure 21:
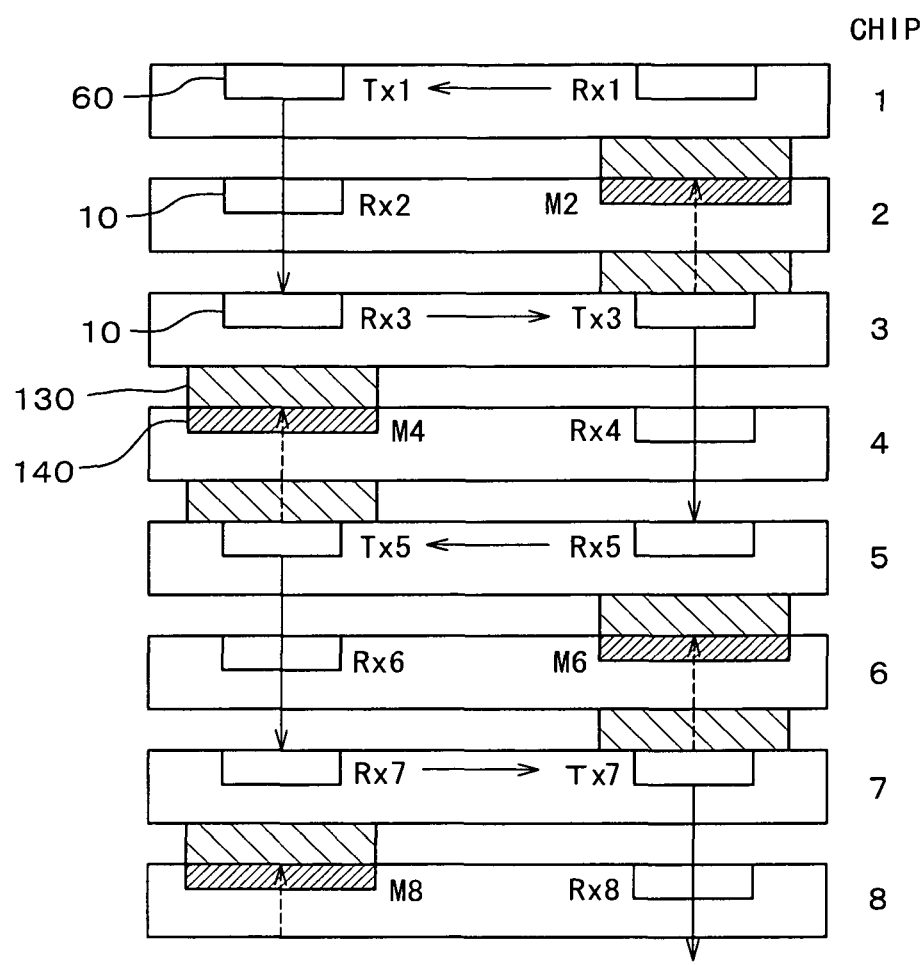
FIG. 21 is a view depicting a structure of a modification of Example 8.
Figure 22:
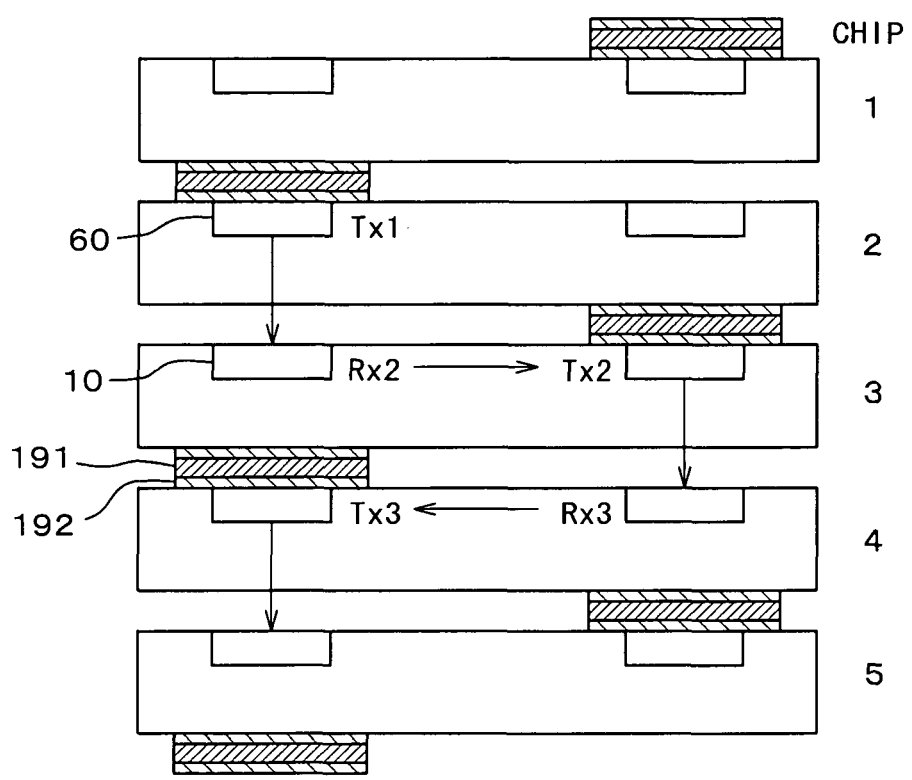
FIG. 22 is a view depicting a structure of a modification of Example 8.

Further, as shown in FIG. 21 and FIG. 22, using a magnetic material film and a metal film in combination also allows increasing such effects.

For FIG. 21, a metal film 140 is used simultaneously with a magnetic material film 130.

For FIG. 22, a structure of sandwiching a metal film 191 with magnetic material films 192 is used.

Figure 23:
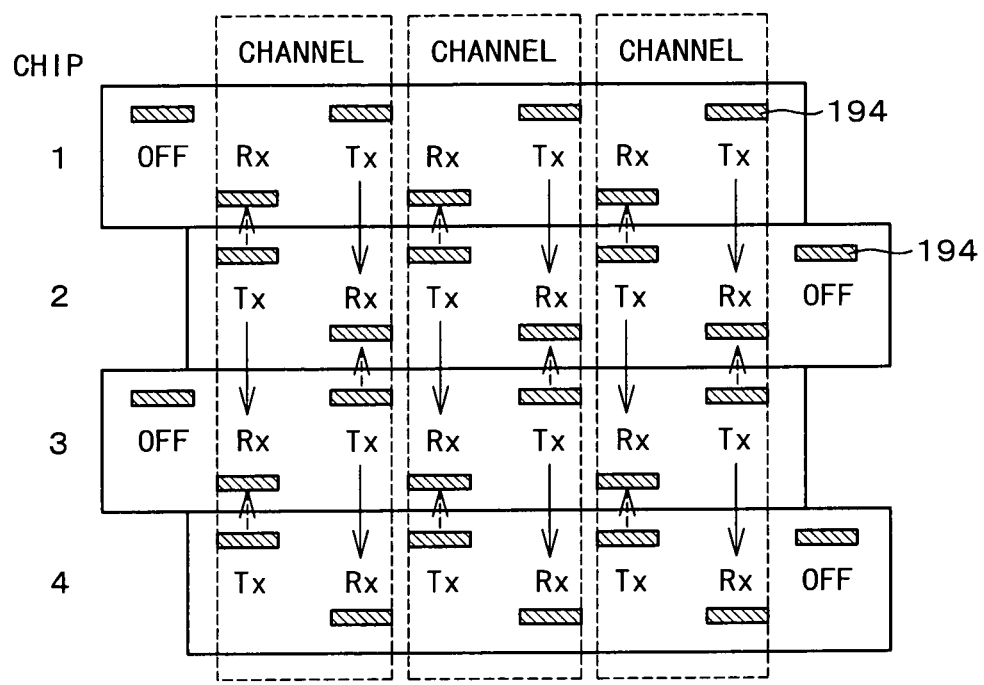
FIG. 23 is a view depicting a structure of a modification of Example 8.

Moreover, by, as shown in FIG. 23, stacking and mounting transmitter coils Tx, receiver coils Rx, and metal films 194 within the same substrate, chips having the same structure can be rotated by 180 degrees while being stacked, and one communication channel can be formed with use of two sets of coils. The number of coils required for a communication channel can be reduced from 3 to 2 as compared to that in the example shown in FIG. 8.

Example 9

Figure 24:
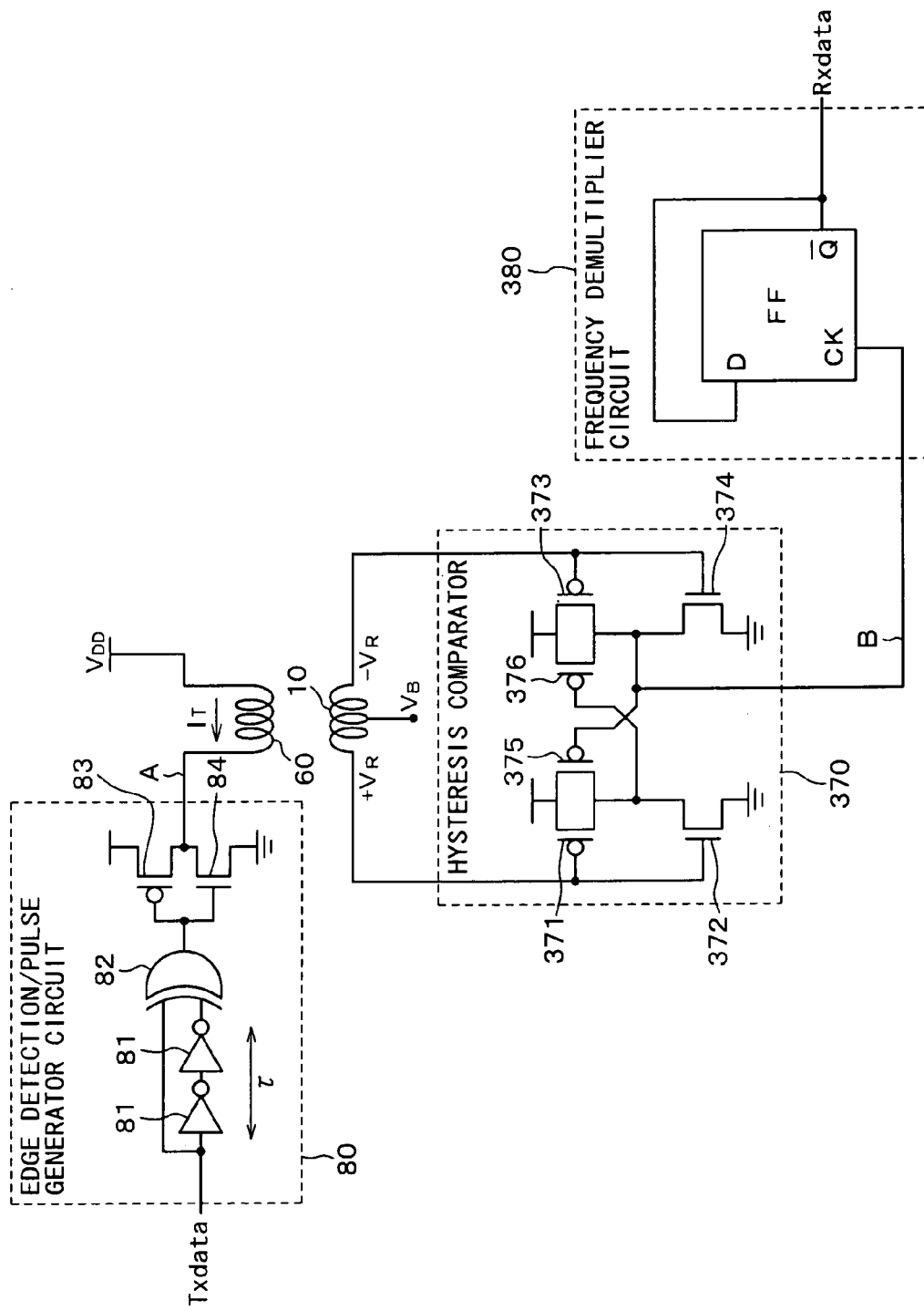
FIG. 24 is a view depicting a configuration of a transmitter according to Example 9.
Figure 25:
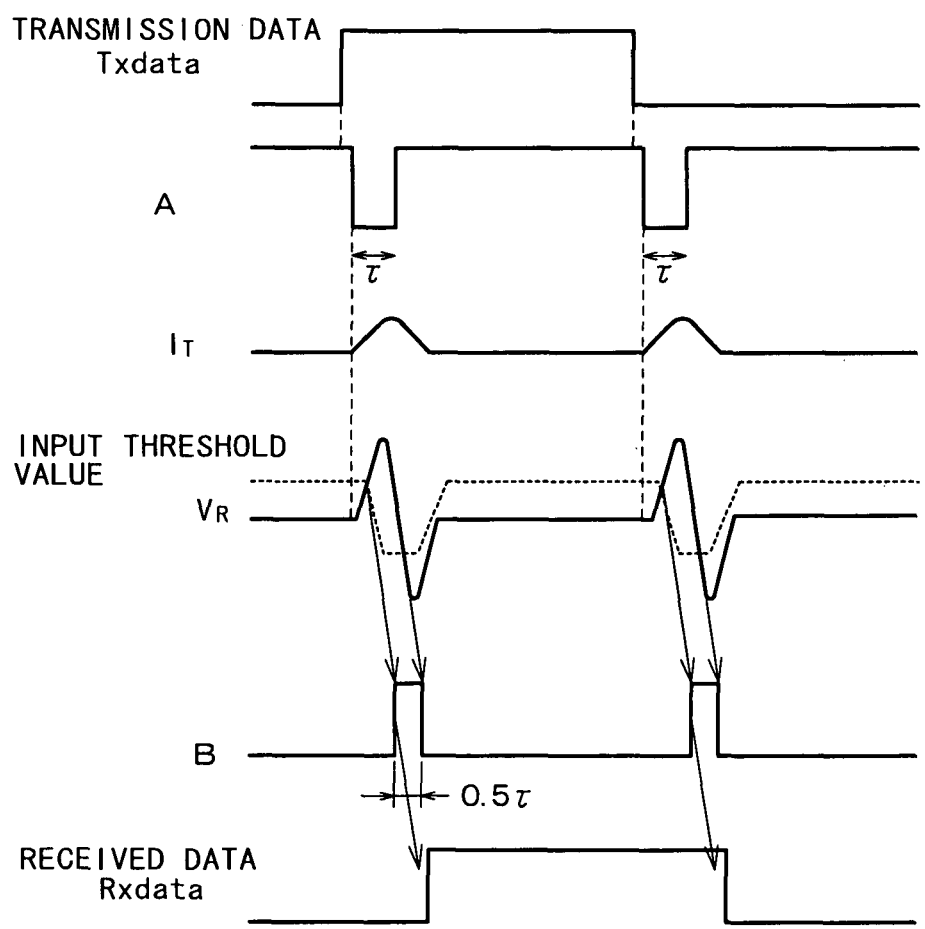
FIG. 25 is a view depicting waveforms of respective signals of Example 9.

FIG. 24 is a view depicting a configuration of a transmitter and a receiver according to Example 9. FIG. 25 is a view depicting waveforms of respective signals of Example 9. The transmitter of the present example is composed of delay lines 81, an EXOR circuit 82, and transistors 83, 84. The receiver of the present example is composed of transistors 371 to 376 being a hysteresis comparator 370 and a frequency demultiplier circuit 380. When no "response" returns as in Examples 3 to 8, data transmission and repeat can be performed by using the pulse transmitter shown in FIG. 24. As shown in FIG. 25, the pulse transmitter, only when the polarity of transmission data is inverted, makes a triangular wave current (IT) flow by a voltage signal with a pulse width τ according to that change. As compared to the transmitter in Example 1 (FIG. 1) where a current (IT) continues to flow even after data transmission, the transmission power can be significantly reduced. In addition, a dotted line near the received signal waveform in the figure indicates an input threshold value of the asynchronous receiver. After receiving a signal, the asynchronous receiver once lowers and then returns the input threshold value to its original value. Accordingly, a pulse signal with a pulse width τ/2 is obtained also at the reception side when the polarity of transmission data is inverted, and this pulse signal is frequency-divided to obtain a received signal Rxdata.

Example 10

Figure 26A:
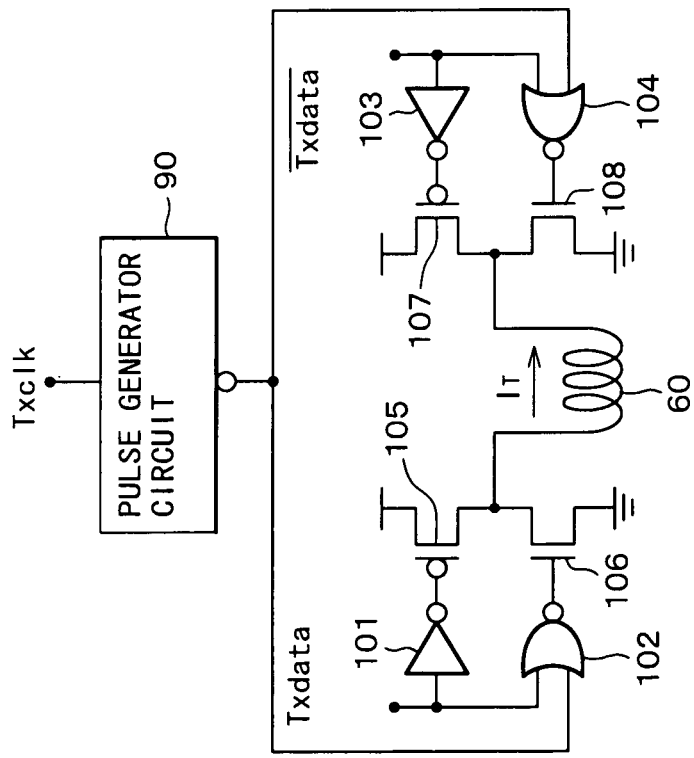
FIG. 26A and FIG. 26B are views depicting a configuration of a transmitter according to Example 10.
Figure 26B:
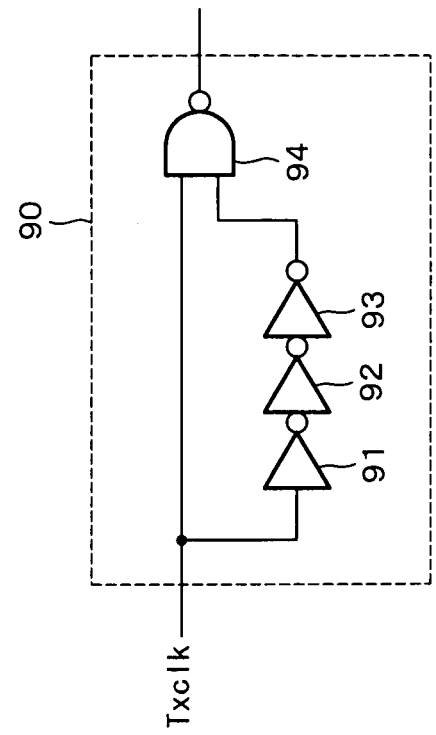

FIG. 26A and FIG. 26B are views depicting a configuration of a transmitter according to Example 10. FIG. 26A depicts a configuration of a transmitter, and FIG. 26B depicts a configuration of a pulse generator circuit. The transmitter of the present example is composed of a pulse generator circuit 90, inverters 101, 103, NOR circuits 102, 104, and transistors 105 to 108, which form a synchronous transmitter. When no "response" returns as in Examples 3 to 8, data transmission and repeat can be performed by using the synchronous transmitter shown in FIG. 26A and FIG. 26B. The pulse generator circuit 90 is composed of inverters 91 to 93 and a NAND circuit 94. The pulse generator circuit 90 is input with a clock Txclk to generate a pulse of a period corresponding to a delay by the inverters 91 to 93.

Figure 27:
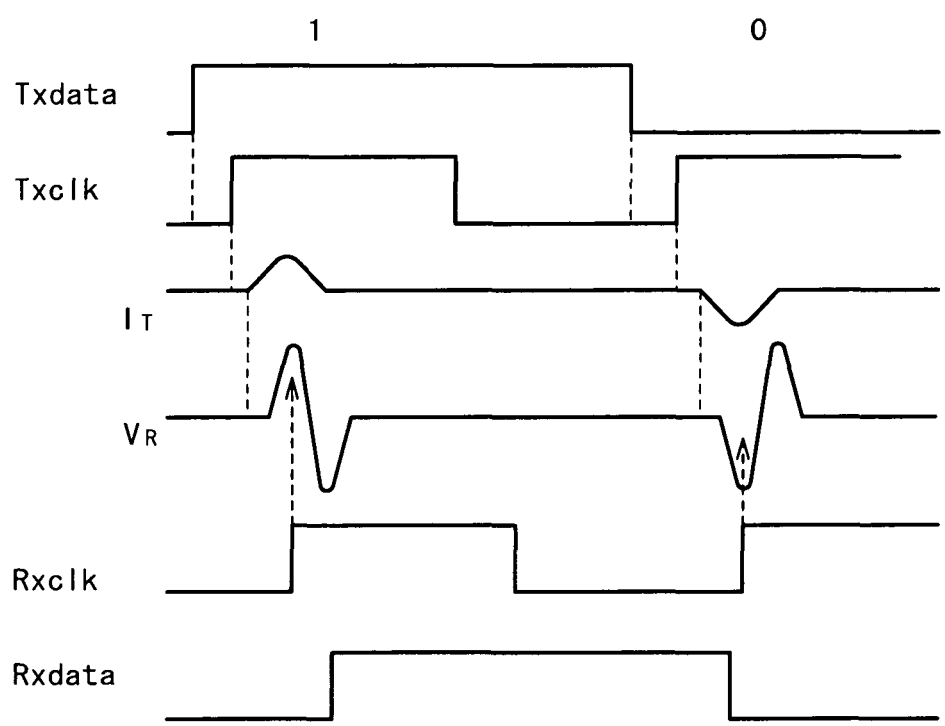
FIG. 27 is a view depicting waveforms of respective signals of Example 10.

FIG. 27 is a view depicting waveforms of respective signals of Example 10. The transmitter makes a positive or negative pulse according to transmission data of a period of a pulse width of the pulse generator circuit 90 flow in a transmitter coil 60. Therefore, as compared to the transmitter in Example 1 (FIG. 1) that continues to make a fixed current flow, the power consumption can be remarkably reduced. In this case, a minute voltage signal (VR) to be generated in a receiver coil is as shown in FIG. 27.

Figure 28:
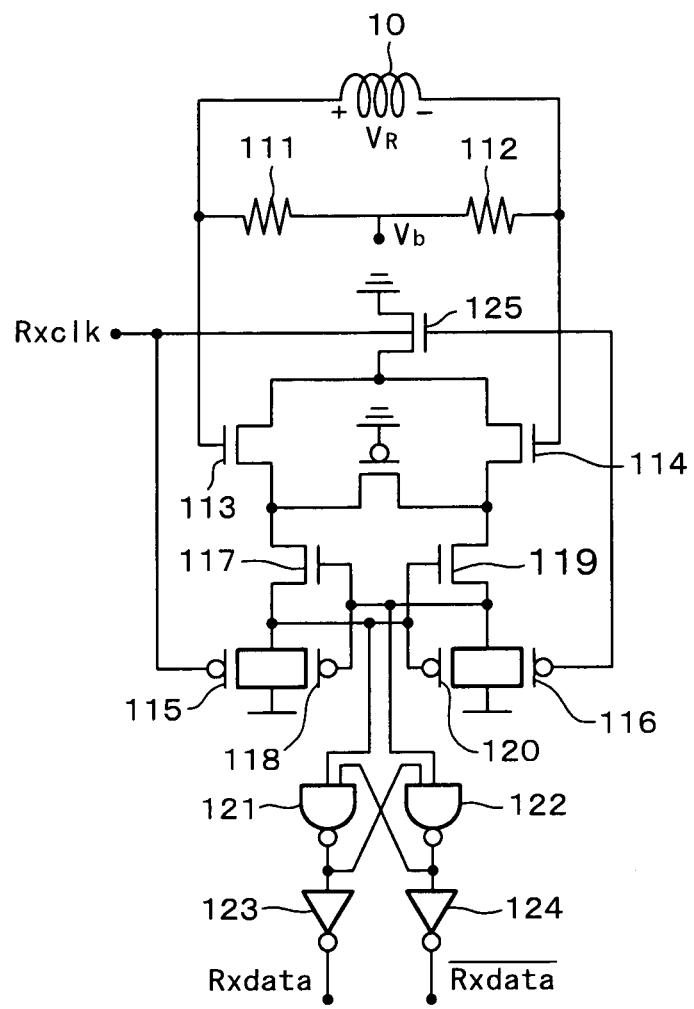
FIG. 28 is a view depicting a configuration of a receiver according to Example 10.

FIG. 28 is a view depicting a configuration of a receiver according to Example 10. The receiver is composed of resistors 111, 112, transistors 113 to 120, 125, NAND circuits 121, 122, and inverters 123, 124, which form a comparator with a latch in their entirety. The receiver receives a receiving clock (synchronization signal) Rxclk externally, and outputs received signal Rxdata. The transistors 113, 114 constitute a differential pair of a differential amplifier, and receive a signal VR from the receiver coil 10. The NAND circuits 121, 122 form a latch. The data received by the differential amplifier is sampled in synchronization with the receiving clock Rxclk to be input into the transistors 115, 116, and latched by the NAND circuits 121, 122, whereby the received signal Rxdata is restored. This receiver is a synchronous type in which a system clock is used for reproduction of data. As shown in FIG. 27, whether being positive or negative can be determined in the middle of a first half (or second half) waveform of a received voltage signal for conversion into a digital signal. Because the synchronous receiver of FIG. 27 consumes only the charge/discharge power when a clock is applied, as compared to the asynchronous receiver in Example 1 (FIG. 1) that continues to make a fixed current flow even during a period where no signal reaches, the power consumption can be remarkably reduced.

Example 11

Figure 29:
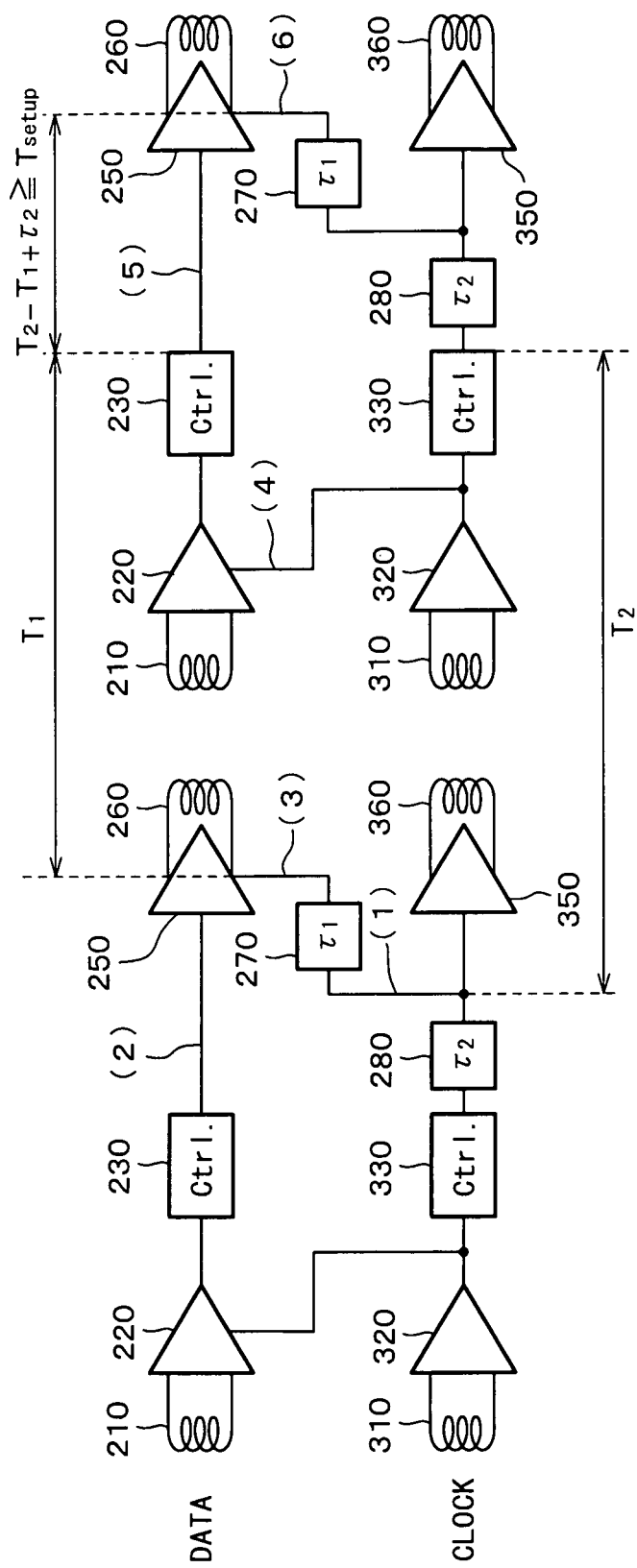
FIG. 29 is a view depicting a configuration of a transmitter and a receiver according to Example 11.
Figure 30:
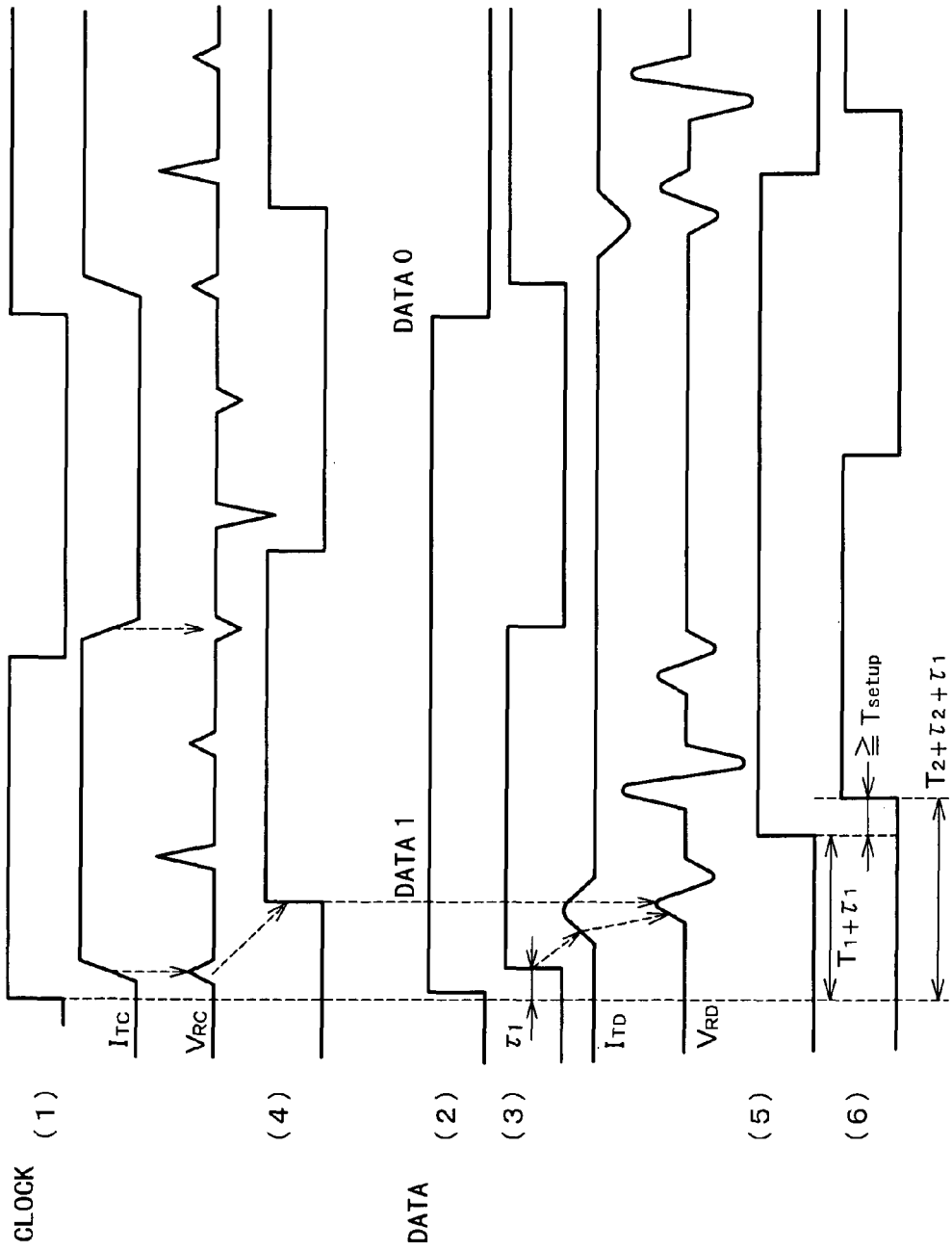
FIG. 30 is a view depicting waveforms of respective portions of Example 11.

FIG. 29 is a view depicting a configuration of a transmitter and a receiver according to Example 11. FIG. 30 is a view depicting waveforms of respective portions of Example 11. This Example 11 is an example of a configuration where the synchronous transmitter and receiver shown in Example 10 (FIG. 27, FIG. 28) are used for data communication, and the asynchronous transmitter and receiver shown in Example 1 (FIG. 1) are used for a clock signal to time the detection of received data pulses. With regard to data, there is provided a receiver coil 210, a receiver 220, a control circuit 230, a transmitter 250, and a transmitter coil 260. With regard to clocks, there is provided a receiver coil 310, a transmitter 320, a control circuit 330, a delay line 228, a transmitter 350, and a transmitter coil 360, and there is further provided a delay line 270 that delays a clock by τ1.

A clock is repeatedly transmitted in such a manner as in FIG. 5. The amount of delay τ1 of the receiving clock signal is adjusted to delay the data transmission timing (3) so that a receiving clock signal (4) allows determining whether being positive or negative in the middle of a first half waveform of a received data pulse. In the data transmitter, data (5) must be input to the transmitter a setup (Tsetup) time or more before the time at which a clock (6) drives the transmitter. The time required for data communication is provided as T1, and the time required for clock communication is provided as T2 (T1 and T2 are generally different from each other because different transmitter and receiver circuits are used for data communication and clock communication). When the propagation time of each signal is determined on the basis of clock transmission timing (1), as shown in FIG. 30, the data (5) arrives after T1+τ1. Moreover, the data transmission timing (6) arrives after T2+τ1+T2. Therefore, the amount of delay τ2 for timing adjustment is adjusted so as to satisfy:

$$(T2+\tau1+T2)-(T1+\tau1) \geq T\text{setup, that is}$$

$$\tau2 \geq T\text{setup}+T1-T2$$

whereby the setup time of the transmitter is secured.

When the value of τ2 takes a negative value, the delay (of τ2) is unnecessary before the clock transmitter.

Example 12

Figure 31:
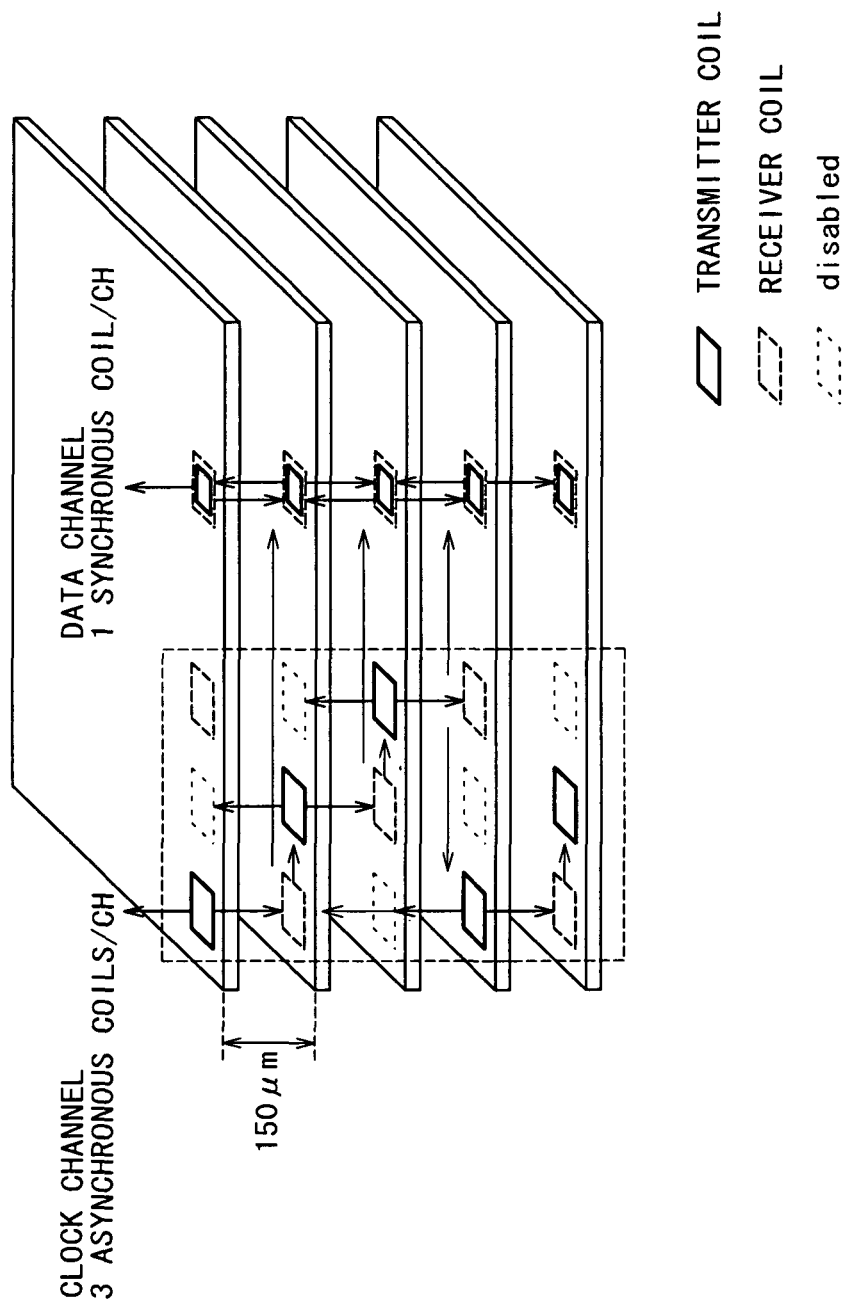
FIG. 31 is a view depicting a structure of an electronic circuit according to Example 12.
Figure 32:
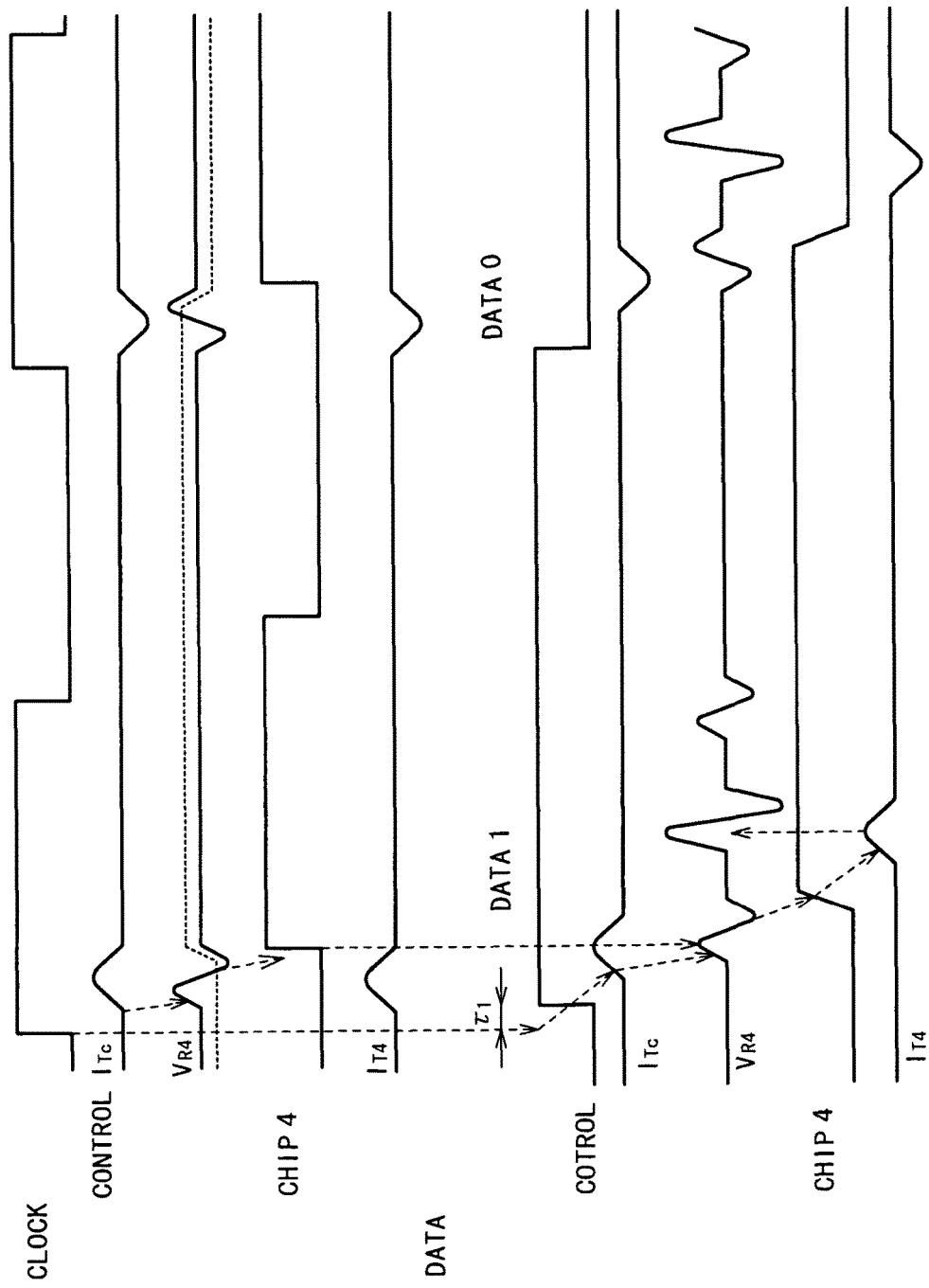
FIG. 32 is a view depicting waveforms of respective portions of Example 12.

FIG. 31 is a view depicting a structure of an electronic circuit according to Example 12. FIG. 32 is a view depicting waveforms of respective portions of Example 12. The present example is an example where the configuration of Example 3 (FIG. 8) is used for clocks, and the configuration of Example 1 (FIG. 2B) is used for data. The clock and data are different in the maximum communication distance to reach, and when the clock and data are repeated by different chips, this results in failure to adjust the timing of both by τ1, leading to a wrong repeating operation. Example 12 is for preventing a clock from being received by a chip other than a target chip by using a plurality of coils. Accordingly, the clock and data can be accurately synchronized. When a clock is transmitted by the pulse transmitter circuit shown in Example 9 (FIG. 24), a current that flows in the transmitter coil is like IT in FIG. 25, so that the transmission power can be significantly reduced. The clock can be received by the asynchronous receiver circuit in Example 1 (FIG. 1). However, because the clock signal is to be received in a second half (opposite in polarity to the first half) of a received pulse signal, an inversion signal of the receiving clock is used for timing of a synchronous data receiver. In addition, a dotted line near the received signal waveform in the figure indicates an input threshold value of the asynchronous receiver. After receiving a LOW signal, the asynchronous receiver prepares for receiving a HIGH signal, while improving noise resistance by changing the input threshold value to a relatively high potential.

Figure 33:
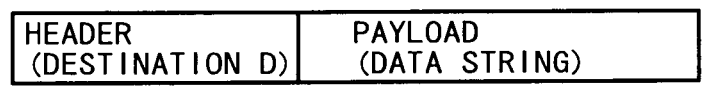
FIG. 33 is a view depicting an example of a data structure to be used for communications of the present invention.

FIG. 33 is a view depicting an example of a data structure to be used for communications of the present invention. In the header, there is specified a communication destination chip. When there are 16 chips, this can be expressed by 4 bits. For example, the tenth memory chip can be represented by 1001. There is the payload of a data string subsequent to the header. In this example, there is a 32-bit data string.

FIG. 34A, FIG. 34B, and FIG. 34C are views depicting an example of programming of stacking position information of substrates by wires. Each chip knows as a chip ID what position (what layer) it is mounted on. The chip ID can be programmed by, for example, bonding wiring or a nonvolatile memory loaded on the chip.

Disabled transmitter and receiver circuits are revived all at once before next data transmission. An enable signal that informs the timing of revival is broadcast to all chips 197 via a common bonding wiring 198 from a control chip (not shown) as shown in FIG. 34A. Thereafter, each chip 197 is again informed of header information by inductive coupling communications, and unnecessary transmitter and receiver circuits are disabled.

By using this enable wiring, information concerning the stacking position of a chip can be further imparted to the chip at a mounting stage of the chip. In the example shown in FIG. 34B, resistors 201, 204, 207 and transistors 202, 205, 208 are connected in series between three pads P1 to P3 (203, 206, 209) and powers provided on each chip 197 to input a bar/detection signal to the gates of the transistors 202, 205, 208. Depending on which of these pads 203, 206, 209 an enable wiring 211 is bonded to, the chip can be informed of whether, as shown in FIG. 34B, the stacking position of the chip has a stacking order such as the first and fourth from the bottom that has a remainder of 1 when divided by 3 (that is, mod 3=1), a stacking order such as the second and fifth that has a remainder of 2 when divided by 3 (that is, mod 3=2), or a stacking order such as the third and sixth that has a remainder of 0 when divided by 3 (that is, mod 3=0). That is, a remainder with a divisor of an integer of 3 representing the stacking order of the chip being a substrate can be used as stacking position information. For example, when the enable wiring 211 is bonded to the pad P3 (209) as shown in FIG. 34B, as a result of making the bar/detection signal low to make the enable signal low, D1 and D2 become high, and D3 becomes low. Thus, which pad 203, 206, 209 the enable wiring 211 has been bonded to can be electrically checked. The resistance value of the resistor 201, 204, 207 is selected to be sufficiently high so that D3 becomes low when the enable signal is made low. Moreover, a direct current flows as an enable signal when the stacking order is checked, but the transistors 202, 205, 208 are turned off when the bar/detection signal is made high, so that a direct current no longer flows.

In the former example, it can be programmed that chips 4, 8, and 12 can be set by using the chip IDs so as to have a repeater function, and the other chips can be set so as not to have a repeater function (that is, so as to prevent a received signal from being sent to a transmitter to be retransmitted).

First, the four bits of the header are transmitted to 32 memory chips. That is, all memory chips receive the header data.

When the transmitter/receiver is an asynchronous circuit, as shown in FIG. 5, the repeater performs retransmission only once. This is because even when received data is repeated, and data retransmitted by the following repeater returns like a "response", the latter data is the same as the data that has been received before, and thus a receiver output (that is, a transmitter input) is unchanged.

When the transmitter/receiver is a synchronous circuit, even when transmitting data same as the previous data, the transmitter changes a current flowing in the transmitter coil, which produces a change in magnetic field. Once a change in magnetic field due to a "response" of data that has been transmitted before occurs, new data cannot be received until that disappears. Therefore, when the transmitter/receiver is a synchronous circuit, control is necessary so as to limit the retransmitting operation to only one time.

When data transmission and reception is implemented by a synchronous circuit, by performing clock transmission and reception to produce its timing synchronization by an asynchronous circuit, a clock does not in "response" become a plurality of times of signals, and thus the retransmitting operation is limited to only one time.

After each chip receives header information, each repeater determines whether to retransmit data as in the following. The data is retransmitted if D<ID<S. That is, the data is retransmitted if the repeater is located between D and S. If not, the data is not retransmitted.

In this way, transmission and reception of a payload data string is started.

Each transmitter/receiver, only when itself is a transmission destination, that is, only when ID=S, receives data. When ID>S, it disables the transmitter and receiver circuit, or does not newly take in a received signal.

A transmitter chip, a receiver chip, and a repeater chip may have the same structure.

However, the present invention is not limited to the above-described examples. Moreover, data in the above description is a discrete signal, and is a binary (digital) or multiple-valued signal. Moreover, the data also includes a control signal and the like.

The present invention may be an electronic circuit being a chip such as a memory composed of one substrate having a coil and a repeater connected to this coil. In this case, a plurality of chips can be stacked and installed to a slot of a personal computer to perform communications between the chips by inductive coupling.

The disclosure of Japanese Patent Application No. 2008-146248, filed on Jun. 3, 2008 including its specification, claims and drawings, is incorporated herein by reference in its entirety.

All the publications, patents and patent applications cited in the present specification are incorporated in the present specification by reference in their entirety.

REFERENCE SIGNS LIST 21, 22, 27-33, 51-54, 71-74, 83, 84, 91-93, 105-108, 113-120, 125, 202, 205, 208, 371-376 Transistor
10, 210, 310 Receiver coil
20, 220, 320 Receiver
23, 25, 101, 103, 123, 124 Inverter
24, 25, 111, 112, 201, 204, 207 Resistor
40, 230, 330 Control circuit
50, 250, 350 Transmitter
60, 260, 360 Transmitter coil
70, 173 Transmitter and receiver coil
75, 76, 121, 122 NAND circuit
81, 228, 270 Delay line
82 EXOR circuit
90 Pulse generator circuit
102, 104 NOR circuit
130, 192 Magnetic material film
140, 141, 142, 150, 160, 174, 180, 190, 194 Metal film
171 First substrate
172 Second substrate
197 Chip
198 Bonding wiring
203, 206, 209 Pad
211 Enable wiring
370 Hysteresis comparator
380 Frequency demultiplier circuit
Rx Receiver coil
Tx Transmitter coil

The invention claimed is:

1. An electronic circuit comprising:
a substrate n (n represents one of numerous substrates stacked in order from 1 to N (N is an integer that is N≥3), that is 1≤n≤N−2) including a transmitter and a first transmitting coil which is connected to the transmitter which transmits a signal by inductive coupling;
a substrate n+x (x is an integer that is 1≤x≤N−n−1) including a repeater, a first receiving coil and a second transmitting coil, the first receiving coil and the second transmitting coil are connected to the repeater which receives a signal transmitted from the transmitter or a signal relayed from another repeater and relays said received signal by inductive coupling; and
a substrate n+y (y is an integer that is x<y≤N−n) including a receiver and a second receiving coil which is connected to the receiver which receives a signal relayed from the repeater,
wherein the first receiving coil is shifted from the second receiving coil and the first transmitting coil is shifted from the second transmitting coil.

2. An electronic circuit comprising:
a substrate n (n represents one of numerous substrates stacked in order from 1 to N (N is an integer that is N≥3), that is 1≤n≤N−2) including a transmitter and a first transmitting coil which is connected to the transmitter which transmits a signal by inductive coupling;
a substrate n+x (x is an integer that is 1≤x≤N−n−1) including a repeater, a first receiving coil and a second transmitting coil, the first receiving coil and the second transmitting coil are connected to the repeater which receives a signal transmitted from the transmitter or a signal relayed from another repeater and relays said received signal by inductive coupling; and
a substrate n+y (y is an integer that is x<y≤N−n) including a receiver and a second receiving coil which is connected to the receiver which receives a signal relayed from the repeater,
wherein the first receiving coil is shifted from the second receiving coil and the first transmitting coil is shifted from the second transmitting coil,
wherein the transmitter asynchronously transmits a timing pulse and synchronously transmits data, the receiver asynchronously receives the timing pulse and synchronously receives the data.

3. An electronic circuit comprising:
substrates stacked in order from substrate (1) to an (N)-th one of the substrates with N being an integer having a value of N≥3,
wherein an (n)-th one of the substrates includes a transmitter and a first transmitting coil with n being an integer having a value of 1≤n≤N−2, the first transmitting coil is connected to the transmitter,
wherein an (n+x)-th one of the substrates includes a repeater, a first receiving coil and a second transmitting coil with x being an integer having a value of 1≤x≤N−n−1, the first receiving coil and the second transmitting coil are connected to the repeater with the first transmitting coil being shifted from the second transmitting coil,
wherein an (n+y)-th one of the substrates includes a receiver and a second receiving coil with y being an integer having a value of x<y≤N−n, the second receiving coil is connected to the receiver with the first receiving coil being shifted from the second receiving coil,
wherein the first transmitting coil is configured to transmit a signal from the transmitter by inductive coupling and the repeater is configured to receive a received signal from the first receiving coil, with either the signal output from the (n)-th one of the substrates or another signal output from another repeater becoming the received signal, and
wherein the second transmitting coil is configured to transmit a relayed signal from the repeater by inductive coupling and the receiver is configured to receive the relayed signal from the second receiving coil, with the received signal output from the (n+x)-th one of the substrates becoming the relayed signal.

4. The electronic circuit according to claim 3, wherein the transmitter asynchronously transmits a timing pulse and synchronously transmits data, the receiver asynchronously receives the timing pulse and synchronously receives the data.

* * * * *